(12) United States Patent
Liaw

(10) Patent No.: US 11,114,345 B2
(45) Date of Patent: Sep. 7, 2021

(54) IC INCLUDING STANDARD CELLS AND SRAM CELLS

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 102 days.

(21) Appl. No.: 16/548,285

(22) Filed: Aug. 22, 2019

(65) Prior Publication Data

US 2021/0057281 A1 Feb. 25, 2021

(51) Int. Cl.
*H01L 21/8234* (2006.01)
*H01L 21/02* (2006.01)
*H01L 21/8239* (2006.01)

(52) U.S. Cl.
CPC ........ *H01L 21/823412* (2013.01); *H01L 21/02123* (2013.01); *H01L 21/02532* (2013.01); *H01L 21/8239* (2013.01); *H01L 21/823487* (2013.01)

(58) Field of Classification Search
CPC ..... H01L 21/823412; H01L 2924/1437; H01L 29/42392
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2018/0151438 A1 | 5/2018 | Chiang |
| 2019/0131274 A1* | 5/2019 | Wu .................. H01L 29/42376 |

* cited by examiner

*Primary Examiner* — Peniel M Gumedzoe
(74) *Attorney, Agent, or Firm* — McClure, Qualey & Rodack, LLP

(57) ABSTRACT

An IC is provided. The IC includes a plurality of P-type gate-all-around (GAA) field-effect transistors (FETs). At least one first P-type GAA FET includes a plurality of silicon (Si) channel regions vertically stacked over an N-type well region. At least one second P-type GAA FET includes a plurality of silicon germanium (SiGe) channel regions vertically stacked over the N-type well region.

20 Claims, 17 Drawing Sheets

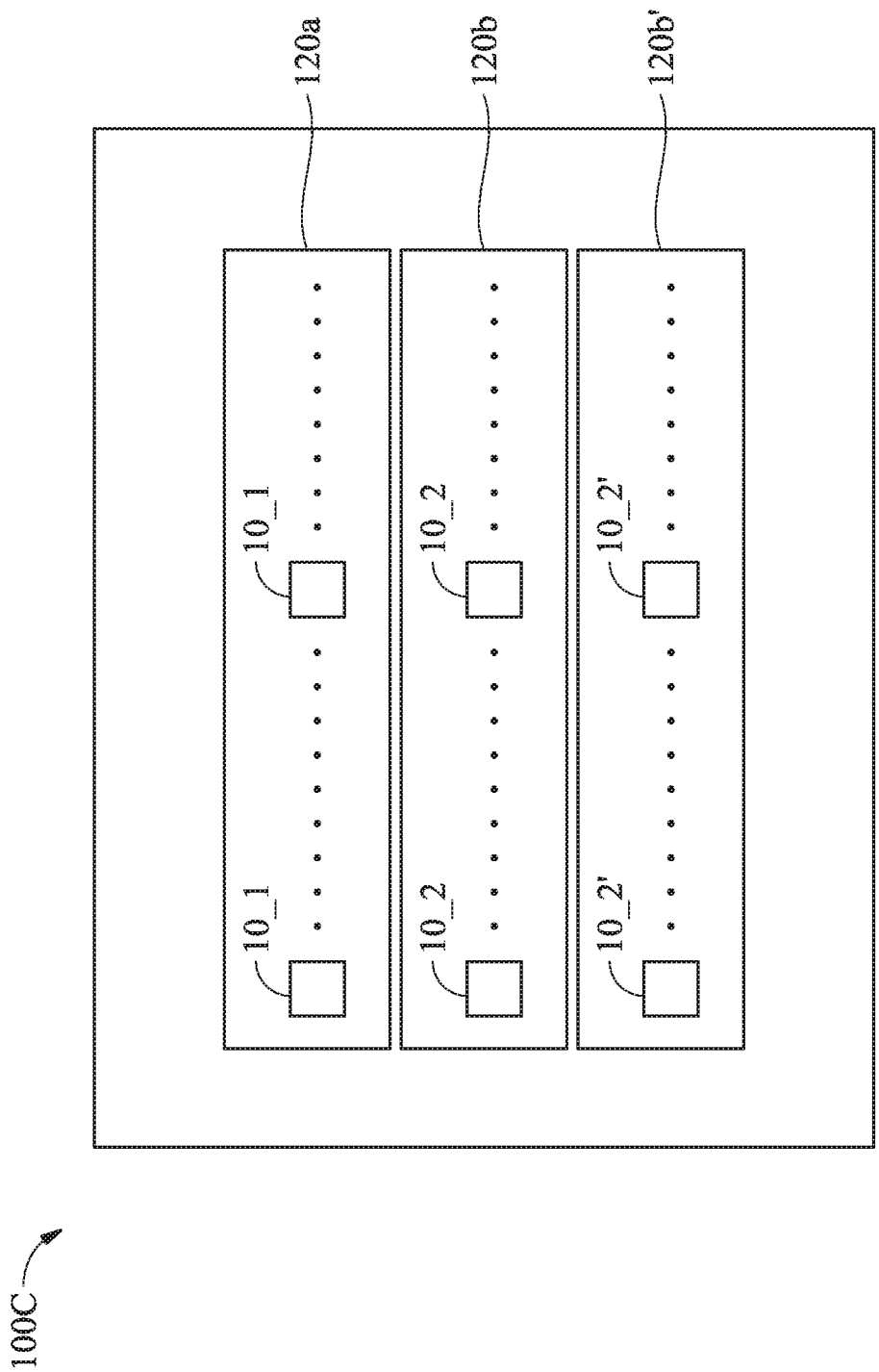

IC INCLUDING STANDARD CELLS AND SRAM CELLS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

Static Random Access Memory (SRAM) is commonly used in integrated circuits. SRAM cells have the advantageous feature of being able to hold data without the need to refresh. With the increasingly demanding requirements on the speed of integrated circuits, the read speed and write speed of SRAM cells have also become more important. With increased down-scaling of the already very small SRAM cells, however, such requests are difficult to achieve.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

FIG. 12C is a simplified diagram of an IC, in accordance with some embodiments of the disclosure.

DETAILED DESCRIPTION

Figure 1:
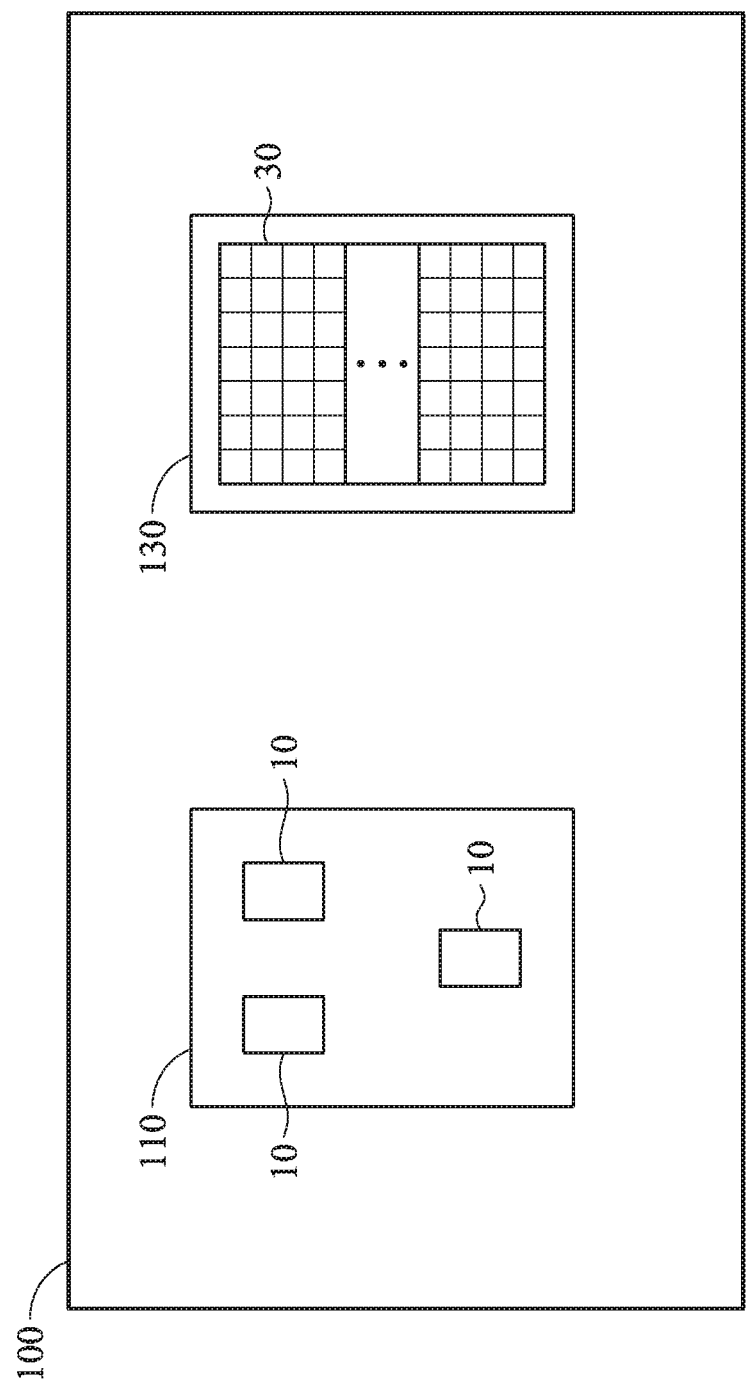
FIG. 1 is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 1 is a simplified diagram of an IC 100, in accordance with some embodiments of the disclosure. The IC 100 includes a logic circuit 110 and a memory 130. In some embodiments, the logic circuit 110 may be the controller for accessing the memory 130. In some embodiments, the logic circuit 110 is configured to perform a specific function or operation according to data stored in the memory 130. The logic circuit 110 includes multiple logic cells 10. In some embodiments, the logic cell 10 may be a standard cell (STD cell). The memory 130 includes multiple memory cells 30 arranged in rows and columns of an array. In some embodiments, the memory cells 30 have the same circuit configuration and the same semiconductor structure. In some embodiments, the memory cell 30 may be a bit cell of SRAM or DRAM.

Figure 2:
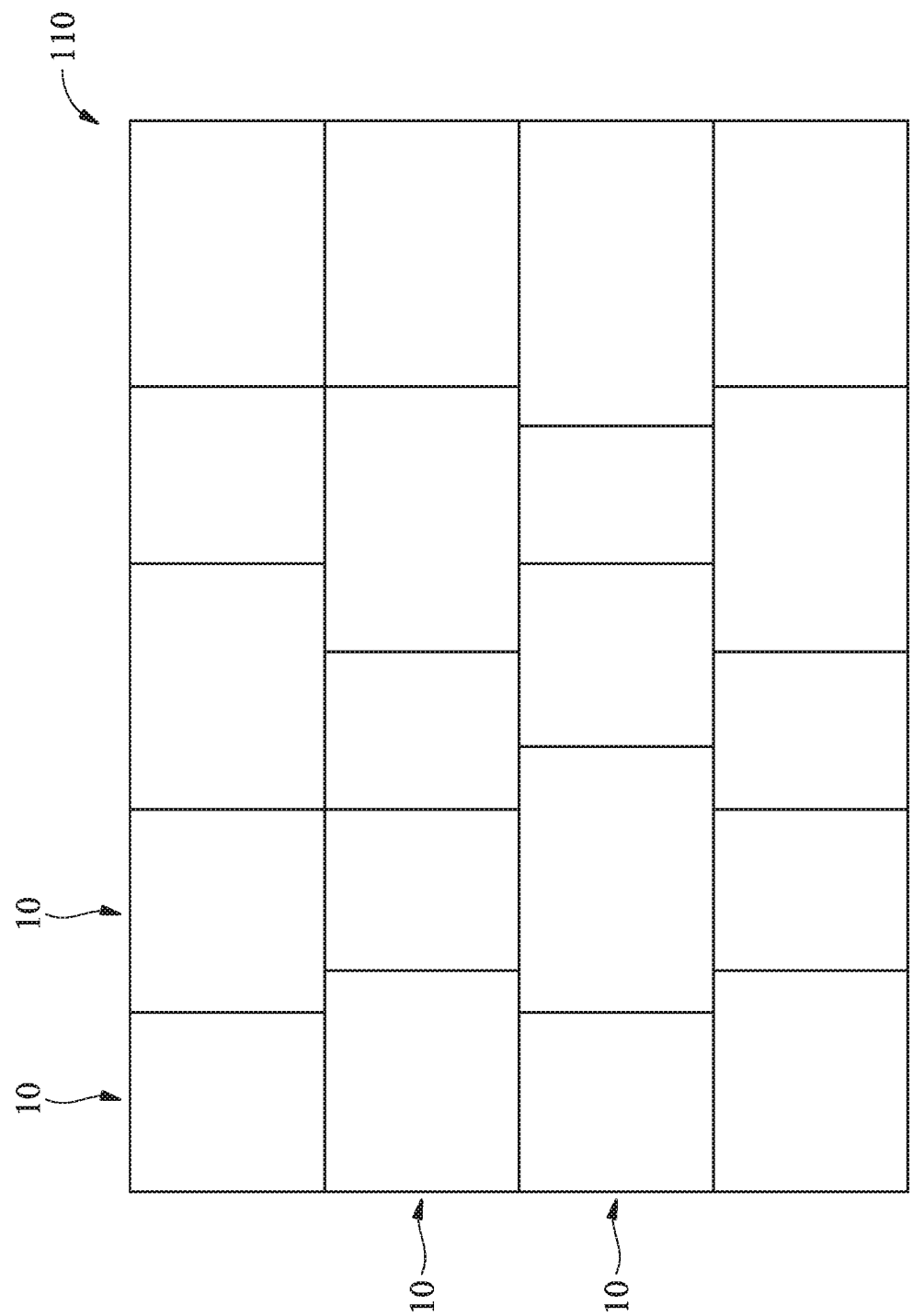
FIG. 2 is a simplified diagram of the logic circuit of FIG. 1, in accordance with some embodiments of the disclosure.

FIG. 2 is a simplified diagram of the logic circuit 110 of FIG. 1, in accordance with some embodiments of the disclosure. In such embodiments, the logic cells 10 form a cell array, and the logic cells 10 have the same cell height. In some embodiments, the cell array is capable of performing a specific function. In some embodiments, the logic cells 10 is capable of performing various functions. In some embodiments, the logic cells 10 are the standard cells (e.g., inverter (INV), AND, OR, NAND, NOR, Flip-Flop, SCAN, etc.), a combination thereof or specific functional cells. Furthermore, each logic cell 10 includes multiple transistors, i.e., PMOS and NMOS transistors. In some embodiments, the logic cells 10 corresponding to the same function or operation may have the same circuit configuration with different semiconductor structures for providing various threshold voltages (Vth or Vt). For example, the semiconductor structures of the transistors in the logic cells 10 are different. In general, the threshold voltage of a field-effect transistor (FET) is the minimum gate-to-source voltage VGS that is needed to create a conducting path between the source and drain regions of the transistor.

Figure 3A:
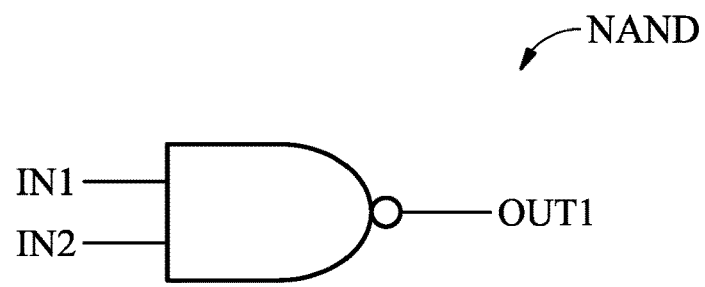
FIG. 3A illustrates the logic symbol of the standard cell NAND.
Figure 3B:
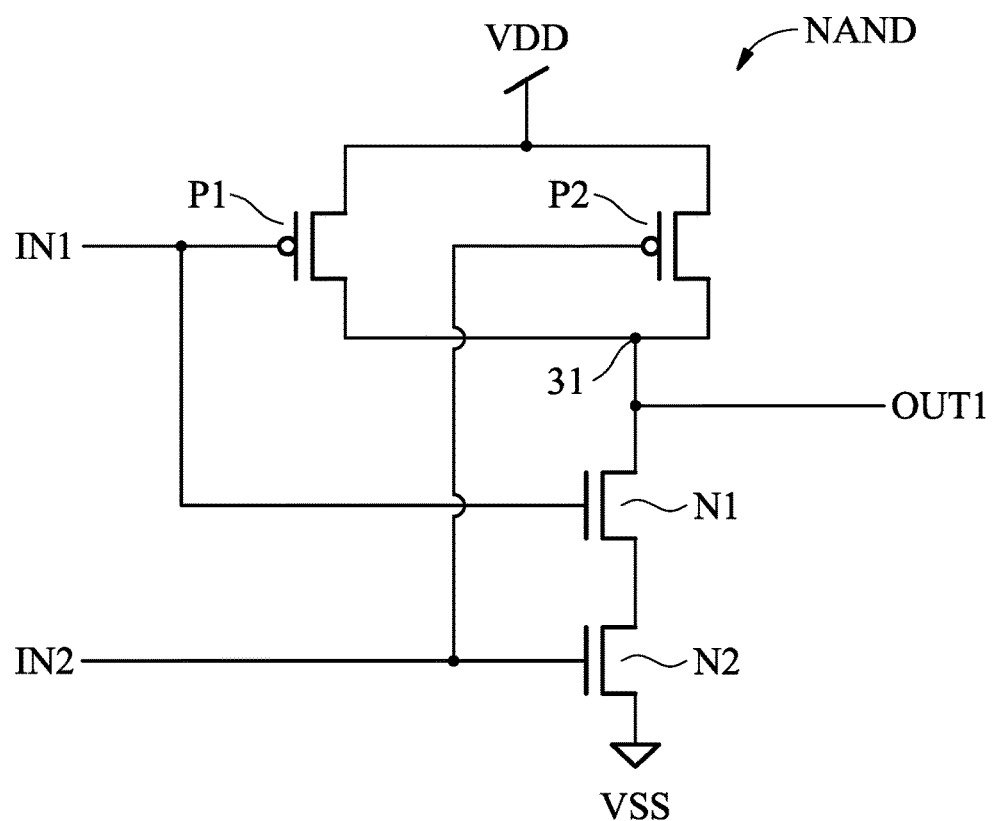
FIG. 3B is a circuit diagram of the standard cell NAND in FIG. 3A.

FIG. 3A illustrates the logic symbol of the standard cell NAND. FIG. 3B is a circuit diagram of the standard cell NAND in FIG. 3A. The standard cell NAND is a logic gate configured to provide an output signal OUT1 according two input signals IN1 and IN2. The standard cell NAND includes two PMOS transistors P1 and P2 and two NMOS transistors N1 and N2. In some embodiments, the two PMOS transistors P1 and P2 and two NMOS transistors N1 and N2 may be gate-all-around (GAA) field effect transistors (FETs).

In the standard cell NAND, the PMOS transistors P1 and P2 are coupled in parallel between a node 31 and a power supply VDD. The NMOS transistor N1 is coupled between the node 31 and the NMOS transistor N2, and the NMOS transistor N2 is coupled between the NMOS transistor N1 and a ground VSS. The input signal IN1 is input to the gates of the PMOS transistor P1 and the NMOS transistor N1, and the input signal IN2 is input to the gates of the PMOS transistor P2 and the NMOS transistor N2. Furthermore, the output signal OUT1 is provided at the node 31.

Figure 4A:
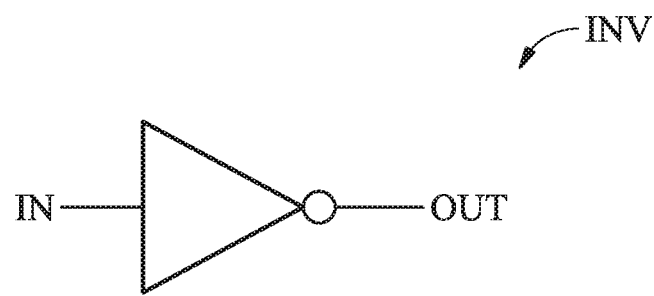
FIG. 4A illustrates the logic symbol of the standard cell INV (i.e., inverter).
Figure 4B:
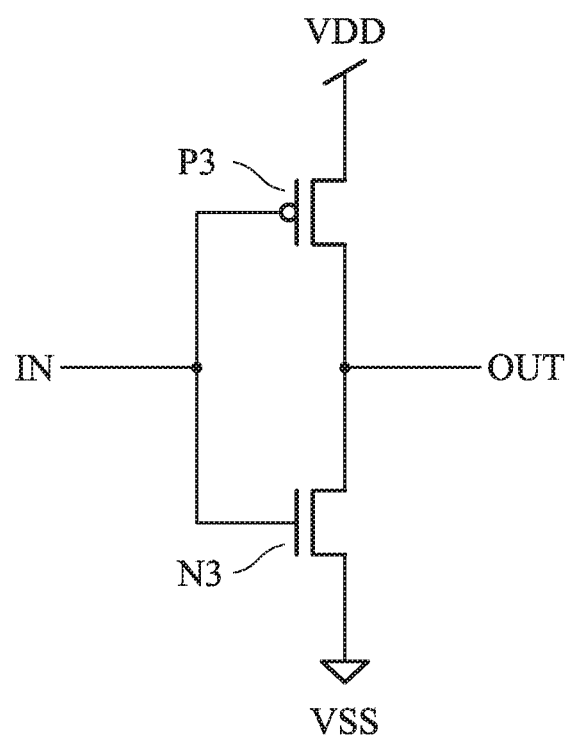
FIG. 4B is a circuit diagram of the standard cell INV in FIG. 4A.

FIG. 4A illustrates the logic symbol of the standard cell INV (i.e., inverter). FIG. 4B is a circuit diagram of the standard cell INV in FIG. 4A. The standard cell INV is a logic gate configured to inverting an input signal IN to provide an output signal OUT. The standard cell INV includes a PMOS transistor P3 and an NMOS transistor N3. In some embodiments, the PMOS transistor P3 and the NMOS transistor N3 may be the GAA FETs.

In the standard cell INV, the PMOS transistor P3 is coupled between the NMOS transistor N3 and a power supply VDD. The NMOS transistor N3 is coupled between the PMOS transistor P3 and a ground VSS. The input signal IN is input to the gates of the PMOS transistor P3 and the NMOS transistor N3. Furthermore, the output signal OUT is provided at the drains of the NMOS transistor N3 and the PMOS transistor P3.

Compared with the FinFET transistors that have a fin bottom portion out of gate control problem and therefore limited the continue shrunk capability, the GAA FETs allows for more aggressive gate length scaling for both performance and density improvement. The GAA FET has vertically-stacked horizontal semiconductor nanowires/nanosheets with extremely narrow cylindrical or sheet channel body. Due to better gate control ability, lower leakage current, shrink capability and fully FinFET device layout comparable, the GAA FET has became a best candidate for future generation and low supply voltage applications.

The GAA FET formed by semiconductor nanowires has smaller channel regions and can allow a non speed-critical circuit to have both lower leakage and power consumption advantages. Furthermore, the GAA FET formed by semiconductor nanosheet has wider channel width for high speed application. Therefore, using both the GAA FETs formed by semiconductor nanowires and the GAA FETs formed by semiconductor nanosheet in one chip can provide design flexibility for speed/power optimization.

Figure 5:
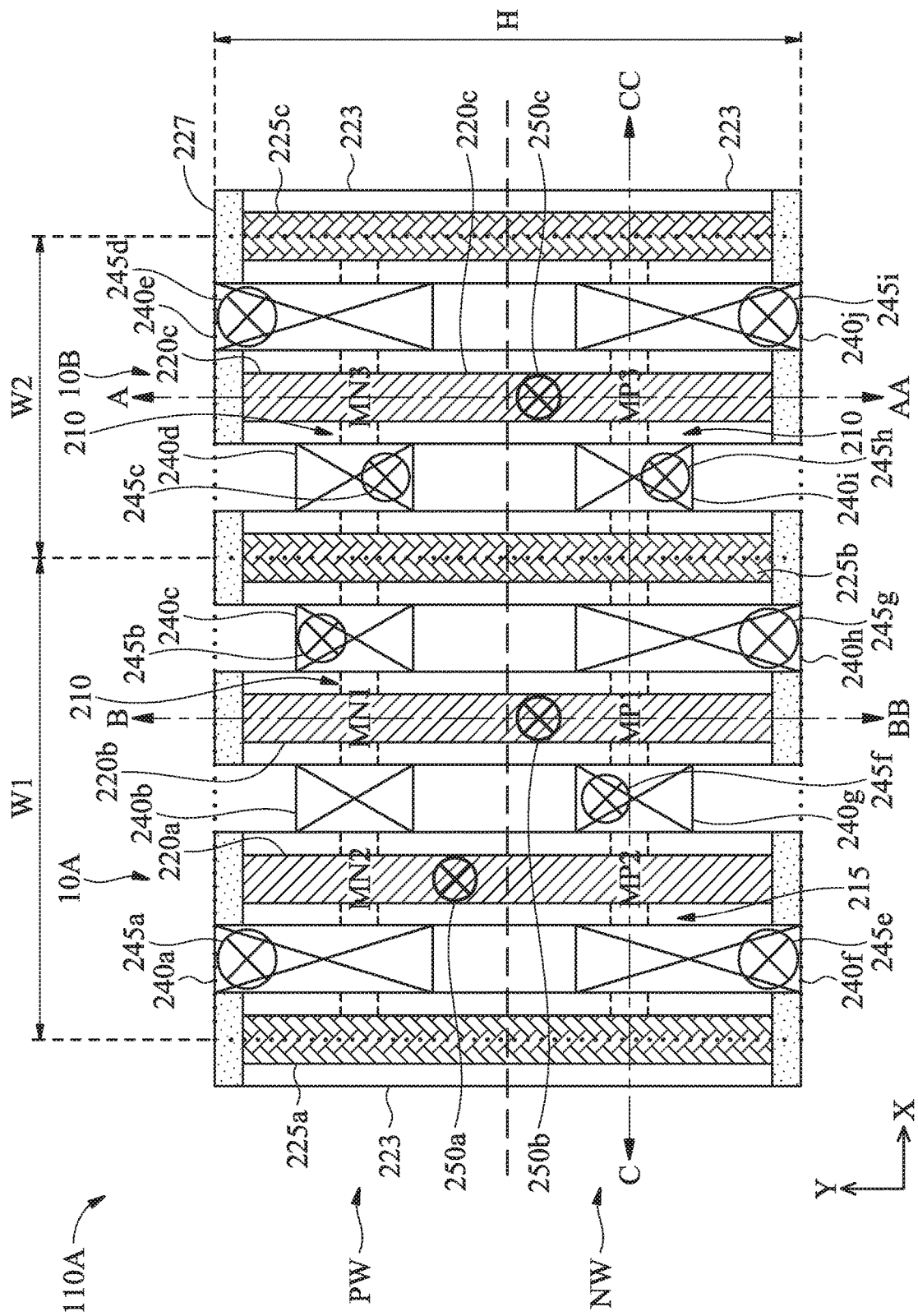
FIG. 5 illustrates a layout of features of a cell array in the logic circuit, in accordance with some embodiments of the disclosure.

FIG. 5 illustrates a layout of features of a cell array in the logic circuit 110A, in accordance with some embodiments of the disclosure. In the logic circuit 110A, a first logic cell 10A and a second logic cell 10B are arranged in the same row. Furthermore, the outer boundary of each of the first logic cell 10A and the second logic cell 10B is illustrated using dashed lines. The first logic cell 10A and the second logic cell 10B have the same cell height H. Furthermore, the cell width W1 of the first logic cell 10A is wider than the cell width W2 of the second logic cell 10B. In FIG. 5, It should be noted that the configuration of the first logic cell 10A and the second logic cell 10B in the logic circuit 110A is used as an illustration, and not to limit the disclosure.

In various embodiments, the row in the cell array of the logic circuit 110A may include more logic cells or fewer logic cells than the layout shown in FIG. 5. In various embodiments, the cell array of the logic circuit 110A may include more rows or fewer rows and more columns or fewer columns than the layout shown in FIG. 5. Each logic cell provides a circuit or portion thereof, exemplary functionality provided by the cells includes, but are not limited to NAND, NOR, AND, XOR, XNOR, SACN, inverter, Flip-Flop, latch, and/or other suitable logic or storage functions.

In FIG. 5, the transistors MN1, MN2, MP1 and MP2 of the first logic cell 10A and the transistors MN3 and MP3 of the second logic cell 10A_2 are the GAA FETs. The NMOS transistors MN1 through MN3 are the NMOS transistors with the Si channel regions. Furthermore, in the second logic cell 10B, the PMOS transistor MP3 is the first-type PMOS transistor with the Si channel regions. In the first logic cell 10A, the PMOS transistors MP1 and MP2 are the second-type PMOS transistors with the SiGe channel regions. In some embodiments, the Ge atomic concentration of the SiGe channel region of the second-type PMOS transistor is within a range of about 5% to about 35%.

The Si channel region of the first-type PMOS transistor is formed by the semiconductor nanowires 210. For the first-type PMOS transistor, the semiconductor nanowires 210 are stacked along the Z-direction (not shown) and are wrapped by the gate electrode, and the Z-direction is perpendicular to the plane formed by the X-direction and Y-direction. The SiGe channel region of the second-type PMOS transistor is formed by the semiconductor nanowires 215. For the second-type PMOS transistor, the semiconductor nanowires 215 are stacked along the Z-direction and are wrapped by the gate electrode. The first-type PMOS transistor with the stacked semiconductor nanowires 210, the second-type PMOS transistors with the stacked semiconductor nanowires 215 and the Z-direction will be described below.

In the first logic cell 10A, the dielectric-base gates 225a and 225b extending in the Y-direction are dummy gates. The gate electrodes 220a and 220b extending in the Y-direction are arranged between the dielectric-base dummy gates 225a and 225b, and the NMOS transistors MN1 and MN2 and the PMOS transistors MP1 and MP2 are surrounded by the dielectric-base dummy gates 225a and 225b. In other words, the dielectric-base dummy gates 225a and 225b are formed in the boundary of the first logic cell 10A. Furthermore, the material of the dielectric-base dummy gates 225a and 225b is different from that of the gate electrodes 220a and 220b.

In the first logic cell 10A, the gate electrode 220a is connected to an overlying level (not shown) through the gate via 250a. Furthermore, the gate electrode 220b is connected to an overlying level (not shown) through the gate via 250b.

For the PMOS transistor MP1, the source/drain region between the gate electrode 220b and the dielectric-base dummy gates 225b is coupled to an overlying level (not shown) through the contact 240h and the via 245g. For the PMOS transistor MP2, the source/drain region between the gate electrode 220a and the dielectric-base dummy gates 225a is coupled to an overlying level (not shown) through the contact 240f and the via 245e. The share source/drain region of the PMOS transistors MP1 and MP2 are coupled to an overlying level (not shown) through the contact 240g and the via 245f. Similarly, the source/drain regions of the NMOS transistors MN2 and MN1 are coupled to respective overlying levels (not shown) through the corresponding contacts (e.g., 240a, 240b and 240c) and the corresponding vias (e.g., 245a and 245b).

In the second logic cell 10B, the dielectric-base gates 225b and 225c extending in the Y-direction are dummy gates. The gate electrode 220c extending in the Y-direction is arranged between the dielectric-base dummy gates 225b and 225c, and the NMOS transistor MN3 and the PMOS transistor MP3 are surrounded by the dielectric-base dummy gates 225b and 225c. In other words, the dielectric-base dummy gates 225b and 225c are arranged in the boundary of the second logic cell 10B. Moreover, the dielectric-base dummy gate 225b is shared by the first logic cell 10A and the second logic cell 10B, i.e., the first logic cell 10A and the second logic cell 10B in the same row are isolated (or separated) from each other by the dielectric-base dummy gate 225b.

In FIG. 5, the spacers 223 are formed on the sidewalls of the dielectric-base gates 225a through 225c and the gate electrodes 220a through 220c. Furthermore, the dielectric regions 227 are formed on the end of the dielectric-base gates 225a through 225c and the gate electrodes 220a through 220c.

In the second logic cell 10B, the gate electrode 220c is connected to an overlying level (not shown) through the gate via 250c. For the PMOS transistor MP3, the source/drain regions are coupled to respective overlying levels (not shown) through the corresponding contacts (e.g., 240i and 240j) and the corresponding vias (e.g., 245h and 245i). For the NMOS transistor MN3, the source/drain regions are coupled to respective overlying levels (not shown) through the corresponding contacts (e.g., 240d and 240e) and the corresponding vias (e.g., 245c and 245d).

In some embodiments, the source/drain regions of the PMOS transistors MP1 through MP3 comprise Boron-doped SiGe. In some embodiments, the Ge atomic concentration of the source/drain regions is within a range of about 36% to about 85%. Furthermore, the source/drain regions of the NMOS transistors MN1 through MN3 comprise SiP, SiC, SiPC, SiAs, Si, or a combination thereof.

Figure 6:
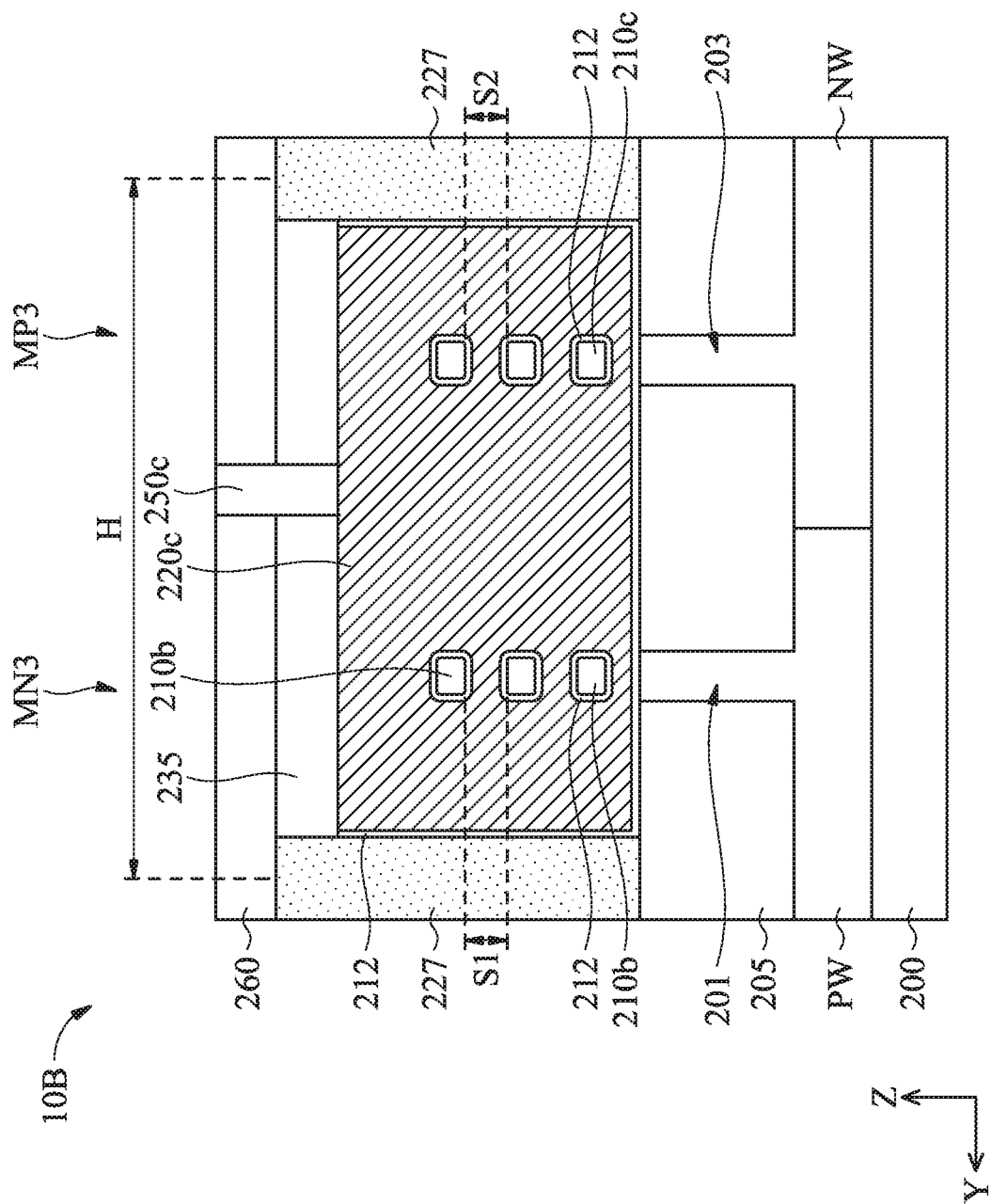
FIG. 6 illustrates a cross-sectional view of the semiconductor structure of the logic circuit along line A-AA in FIG. 5, in accordance with some embodiments of the disclosure.

FIG. 6 illustrates a cross-sectional view of the semiconductor structure of the logic circuit 110A along line A-AA in FIG. 5, in accordance with some embodiments of the disclosure. The P-type well region PW and the N-type well region NW are formed over a substrate 200. In some embodiments, the substrate 200 is a Si substrate. In some embodiments, the material of the substrate 200 is selected from a group consisting of bulk-Si, SiP, SiGe, SiC, SiPC, Ge, SOI-Si, SOI-SiGe, III-VI material, or a combination thereof.

A well portion 201 is formed on the P-type well region PW. In some embodiments, the well portion 201 is a portion of the P-type well region PW and extends into the shallow trench isolation (STI) 205 along to the Z-direction. In other words, the well portion 201 is surrounded by the STI 205. In some embodiments, the well portion 201 includes an appropriate concentration of P-type dopants (e.g., boron (such as 11B), boron, boron fluorine (BF2), or a combination thereof).

A well portion 203 is formed on the N-type well region NW. In some embodiments, the well portion 203 is a portion of the N-type well region NW and extends into the STI 205 along to the Z-direction. In other words, the well portion 203 is surrounded by the STI 205. In some embodiments, the well portion 203 includes an appropriate concentration of N-type dopants (e.g., phosphorous (such as 31P), arsenic, or a combination thereof).

The gate dielectric layer 212 is formed over the STI 205 and the well portions 201 and 203. The gate electrode 220c is formed over the gate dielectric layer 212. In some embodiments, the gate electrode 220c is made of conductive material, such as aluminum (Al), copper (Cu), tungsten (W), titanium (Ti), tantalum (Ta), or other applicable materials. In some embodiments, the gate structure of the gate electrode 220c includes multiple material structure selected from a group consisting of poly gate/SiON structure, metals/high-K dielectric structure, Al/refractory metals/high-K dielectric structure, silicide/high-K dielectric structure, or combination.

The dielectric regions 227 are formed on opposite sides of the gate electrode 220c. As described above, the gate electrode 220c extends in the Y-direction between the dielectric regions 227. In some embodiments, each dielectric region 227 is a gate-cut structure for the gate structure corresponding to the gate electrode 220c, and the gate-cut structure is formed by a cut metal gate (CMG) process. Furthermore, the gate dielectric layer 212 is also formed between the dielectric regions 227 and the gate electrode 220c.

In some embodiments, the gate dielectric layer 212 is made of silicon oxide (SiOx), silicon nitride (SixNy), silicon oxynitride (SiON), dielectric material(s) with high dielectric constant (high-k), or a combination thereof. In some embodiments, the gate dielectric layer 212 is deposited by a plasma enhanced chemical vapor deposition (PECVD) process or by a spin coating process. The high dielectric constant (high-k) material may be hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. In some embodiments, the gate dielectric layer 212 includes Lanthanum (La) dopant.

One or more work-function layers (not shown) are formed between the gate dielectric layer 212 and the gate electrode 220c. In some embodiments, the work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

In some embodiments, the gate electrode 220c is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

The semiconductor nanowires 210b are stacked along the Z-direction over the well portion 201, and the semiconductor nanowires 210b are surrounded by the gate electrode 220c. Furthermore, the gate dielectric layer 212 is also formed between the semiconductor nanowires 210b and the gate electrode 220c. The semiconductor nanowires 210c are stacked along the Z-direction over the well portion 203, and the semiconductor nanowires 210c are surrounded by the gate electrode 220c. Furthermore, the gate dielectric layer 212 is also formed between the semiconductor nanowires 210c and the gate electrode 220c. In some embodiments, a first space S1 between two adjacent semiconductor nanowires 210b is substantially the same as a second space S2 between two adjacent semiconductor nanowires 210c. In some embodiments, the thickness of the semiconductor nanowires 210b and 210c is within a range about 3 nm to about 10 nm.

In some embodiments, before the gate dielectric layer 212 is formed, multiple first semiconductor layers (not shown) and multiple second semiconductor layers (not shown) are stacked to form a stacked semiconductor structure (not shown). The first semiconductor layers and the second semiconductor layers are epitaxially grown over the P-type well region PW and the N-type well region NW. Furthermore, the first semiconductor layers and the second semiconductor layers are made of materials having different lattice constants. In some embodiments, the first semiconductor layers and the second semiconductor layers are made of Si, or a Si compound. In the stacked semiconductor structure, the first semiconductor layers are sacrificial layers which are subsequently partially removed, and the second semiconductor layers are subsequently formed into the semiconductor nanowires 210b and 210c. As described above, the semiconductor nanowires 210b and 210c are Si-base nanowire.

After the stacked semiconductor structure formed by the first and second semiconductor layers are formed, a dummy gate is formatted on the stacked semiconductor structure, and the dummy gate is formed, and the dummy gate includes the dummy gate oxide, and the dummy poly gate.

After the source and drain regions are formed, the dummy gate is removed to expose the stacked semiconductor structure. For the transistors with the SiGe channel, the first semiconductor layers (e.g., the sacrificial layers) of the stacked semiconductor structure are selective oxidized, and then the oxidation are selective removed. Next, SiGe or Ge material is epitaxially grown on the second semiconductor layers and then is annealed, so as to provide better threshold voltage mismatch (AVt) for the PMOS transistors. Next, the gate dielectric layer and the work-function metal layers are formed. For the transistors with the Si channel, no SiGe or Ge material is epitaxially grown on the second semiconductor layers.

In FIG. 6, a hard mask layer 235 is formed over the gate electrode 220c and between the dielectric regions 227. Furthermore, the hard mask layer 235 is made of dielectric material. The Inter-Layer Dielectric (ILD) layer 260 is formed over the hard mask layer 235 and the dielectric regions 227. In some embodiments, the ILD layer 260 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The gate via 250c is formed in the ILD layer 260 and the hard mask layer 235. As described above, the gate electrode 220c is connected to an overlying level (not shown) through the gate via 250c for receiving the input signal IN of the standard cell INV corresponding to the second logic cell 10B.

Figure 7:
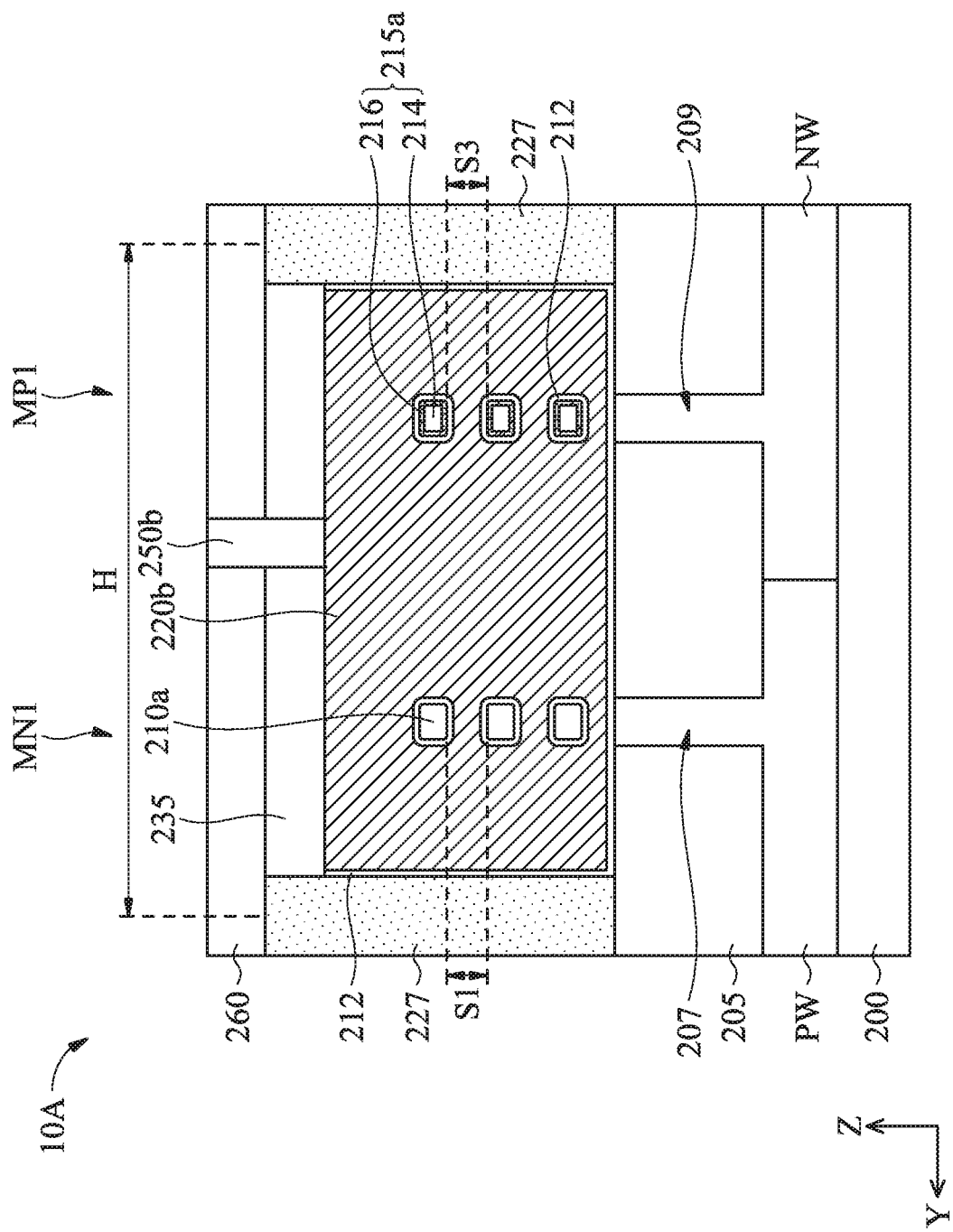
FIG. 7 illustrates a cross-sectional view of the semiconductor structure of the logic circuit along line B-BB in FIG. 5, in accordance with some embodiments of the disclosure.

FIG. 7 illustrates a cross-sectional view of the semiconductor structure of the logic circuit 110A along line B-BB in FIG. 5, in accordance with some embodiments of the disclosure. The P-type well region PW and the N-type well region NW are formed over the substrate 200.

A well portion 207 is formed on the P-type well region PW. In some embodiments, the well portion 207 is a portion of the P-type well region PW and extends into the STI 205 along to the Z-direction. In some embodiments, the well portion 207 includes an appropriate concentration of P-type dopants (e.g., boron (such as 11B), boron, boron fluorine (BF2), or a combination thereof).

A well portion 209 is formed on the N-type well region NW. In some embodiments, the well portion 209 is a portion of the N-type well region NW and extends into the STI 205 along to the Z-direction. In some embodiments, the well portion 209 includes an appropriate concentration of N-type dopants (e.g., phosphorous (such as 31P), arsenic, or a combination thereof).

The gate dielectric layer 212 is formed over the STI 205 and the well portions 207 and 209. The gate electrode 220b is formed over the gate dielectric layer 212. The dielectric regions 227 are formed on opposite sides of the gate electrode 220b. As described above, the gate electrode 220b extends in the Y-direction between the dielectric regions 227. Furthermore, each dielectric region 227 is a gate-cut structure for the gate structure corresponding to the gate electrode 220b, and the gate-cut structure is formed by a CMG process. Furthermore, the gate dielectric layer 212 is also formed between the dielectric regions 227 and the gate electrode 220b. In some embodiments, the gate dielectric layer 212 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof.

One or more work-function layers (not shown) are formed between the gate dielectric layer 212 and the gate electrode 220b. In some embodiments, the work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

The semiconductor nanowires 210a are stacked along the Z-direction over the well portion 207, and the semiconductor nanowires 210a are surrounded by the gate electrode 220b. Furthermore, the gate dielectric layer 212 is also formed between the semiconductor nanowires 210a and the gate electrode 220b. The semiconductor nanowires 215a are stacked along the Z-direction over the well portion 209, and the semiconductor nanowires 215a are surrounded by the gate electrode 220b. Furthermore, the gate dielectric layer 212 is also formed between the semiconductor nanowires 215a and the gate electrode 220b. In some embodiments, a first space S1 between two adjacent semiconductor nanowires 210a is substantially the same as a third space S3 between two adjacent semiconductor nanowires 215a. In some embodiments, the ratio of the first space Si to the third space S3 is within about 5%. In some embodiments, the thickness of the semiconductor nanowires 210a and 215a is within a range about 3 nm to about 10 nm.

The semiconductor nanowires 210a are Si-base nanowires, and the formation of the nanowires 210a is similar to that of the nanowires 210b and 210c of FIG. 6. Furthermore, compared with the nanowires 210a through 210c, the semiconductor nanowires 215a are SiGe-base nanowire. Specifically, the semiconductor nanowires 215a include Ge material, and the nanowires 210a through 210c do not include Ge material. The formation of the nanowires 210a through 210c is different from that of the nanowires 215a. In some embodiments, the nanowires 215a are formed by doping Ge into the Si-base nanowire. In some embodiments, the nanowires 215a are formed by epitaxially growing SiGe or Ge material on the Si-base nanowire and then annealing, as described above. In other words, the nanowires 215a are formed by performing additional processes on the Si-base nanowires. For example, the nanowires 215a are formed by forming an epitaxy layer 216 on the surface of the Si-base semiconductor layer 214, and the material of epitaxy layer 216 includes SiGe or Ge. In some embodiments, the Si-base semiconductor layer 214 may be a Si-base nanowire.

A hard mask layer 235 is formed over the gate electrode 220b and between the dielectric regions 227. Furthermore, the hard mask layer 235 is made of dielectric material. The ILD layer 260 is formed over the hard mask layer 235 and the dielectric regions 227. Furthermore, the gate via 250b is formed in the ILD layer 260. As described above, the gate electrode 220b is connected to an overlying level through the gate via 250b for receiving the input signal IN1 of the standard cell NAND corresponding to the first logic cell 10A.

Figure 8B:
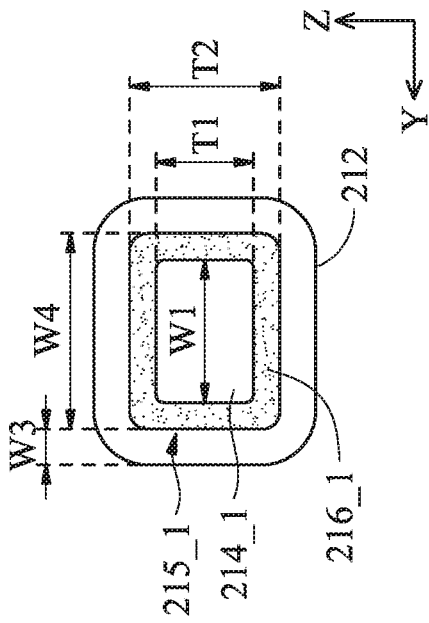
FIG. 8B illustrates a cross-sectional view of a semiconductor nanowire, in accordance with some embodiments of the disclosure.
Figure 8D:
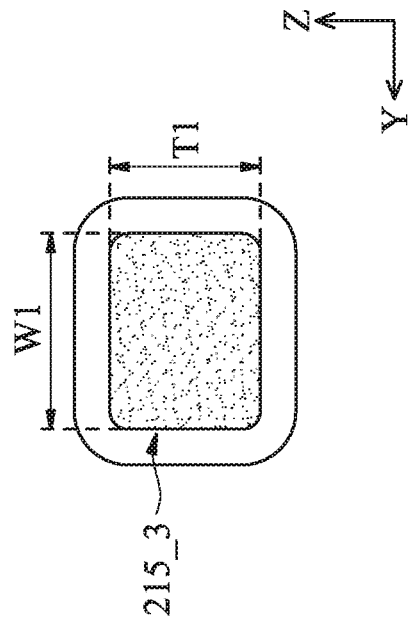
FIG. 8D illustrates a cross-sectional view of a semiconductor nanowire, in accordance with some embodiments of the disclosure.
Figure 8A:
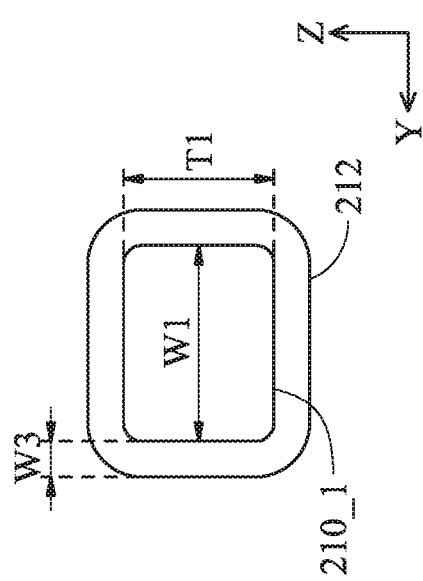
FIG. 8A illustrates a cross-sectional view of a semiconductor nanowire, in accordance with some embodiments of the disclosure.

FIG. 8A illustrates a cross-sectional view of a semiconductor nanowire 210_1, in accordance with some embodiments of the disclosure. In FIG. 8A, the semiconductor nanowire 210_1 is a Si-base nanowire. The semiconductor nanowire 210_1 is surrounded by the gate dielectric layer 212, and the gate dielectric layer 212 has the thickness W3. In such embodiments, the semiconductor nanowire 210_1 has a width W1 along to the Y-direction and a height T1 along to the Z-direction. In some embodiments, the width W1 is less than twice the height T1. In some embodiments, the semiconductor nanowire 210_1 can be implemented as the semiconductor nanowires of the NMOS transistors MN3 and MN1 in FIG. 5. Moreover, the semiconductor nanowire 210_1 can be implemented as the semiconductor nanowire of the transistor MP3 in FIG. 5.

FIG. 8B illustrates a cross-sectional view of a semiconductor nanowire 215_1, in accordance with some embodiments of the disclosure. In FIG. 8B, the semiconductor nanowire 215_1 is a SiGe-base nanowire. The semiconductor nanowire 215_1 includes a Si-base semiconductor layer 214_1 and an epitaxy layer 216_1, and the epitaxy layer 216_1 is formed on the surface of the Si-base semiconductor layer 214_1. In other words, the Si-base semiconductor layer 214_1 is surrounded by the epitaxy layer 216_1. Moreover, the semiconductor nanowire 215_1 is surrounded by the gate dielectric layer 212, and the gate dielectric layer 212 has the thickness W3. In such embodiments, the Si-base semiconductor layer 214_1 has a width W1 along to the Y-direction and a height T1 along to the Z-direction, and the size of the Si-base semiconductor layer 214_1 is the same as that of the semiconductor nanowire 210_1 in FIG. 8A. The semiconductor nanowire 215_1 has a width W4 along to the Y-direction and a height T2 along to the Z-direction, where W4>W1 and T2>T1. Furthermore, the ratio of the widths W1 to W4 is within about 5%, and the ratio of the heights T1 to T2 is within about 5%. In some embodiments, the semiconductor nanowire 215_1 can be implemented as the semiconductor nanowires of the PMOS transistors MP1 and MP2 in FIG. 5. In some embodiments, the Si-base semiconductor layer 214_1 may be a Si-base nanowire for the NMOS transistor, and has the structure or configuration similar to the semiconductor nanowire 210_1 of FIG. 8A. In some embodiments, the P-type GAA FETs having the semiconductor nanowires 215_1 vertically stacked over the N-type well region NW and the N-type GAA FETs having the Si-base semiconductor layer 214_1 vertically stacked over the P-type well region PW are implemented in the same logic cell.

In some embodiments, the Ge atomic concentration of the SiGe channel regions formed by the semiconductor nanowires 215_1 of a PMOS transistor is within a range of 5%~35%. In some embodiments, the Ge atomic concentration of the SiGe channel regions can be modified to form various PMOS transistors with different Ge atomic concentration.

Figure 8C:
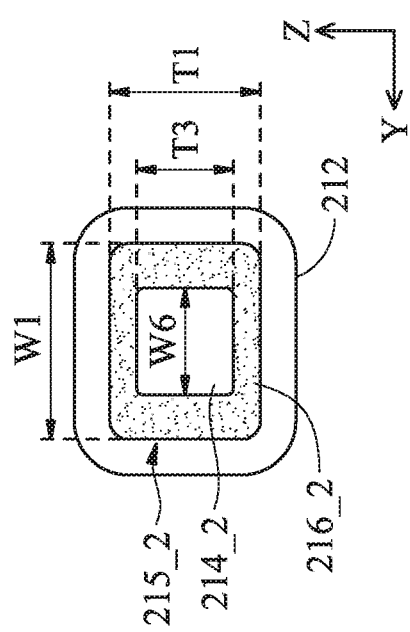
FIG. 8C illustrates a cross-sectional view of a semiconductor nanowire, in accordance with some embodiments of the disclosure.

FIG. 8C illustrates a cross-sectional view of a semiconductor nanowire 215_2, in accordance with some embodiments of the disclosure. In FIG. 8C, the semiconductor nanowire 215_2 is a SiGe-base nanowire. The semiconductor nanowire 215_2 includes a Si-base semiconductor layer 214_2 and an epitaxy layer 216_2, and the epitaxy layer 216_2 is formed on the surface of the Si-base semiconductor layer 214_2. In other words, the Si-base semiconductor layer 214_2 is surrounded by the epitaxy layer 216_2. Moreover, the semiconductor nanowire 215_2 is surrounded by the gate dielectric layer 212. In such embodiments, the Si-base semiconductor layer 214_2 has a width W6 along to the Y-direction and a height T3 along to the Z-direction, and the semiconductor nanowire 215_2 has a width W1 along to the Y-direction and a height T1 along to the Z-direction, where W1>W6 and T1>T3. Furthermore, the semiconductor nanowire 215_2 can be implemented as the semiconductor nanowires of the PMOS transistors MP1 and MP2 in FIG. 5. In some embodiments, the Si-base semiconductor layer 214_2 is formed by performing another etch process on the Si-base nanowire (e.g., the semiconductor nanowire 210_1 of FIG. 8A) or the Si-base semiconductor layer (e.g., the Si-base semiconductor layer 214_1 of FIG. 8B) before the epitaxy layer 216_2 is formed. Thus, the semiconductor nanowire 215_2 has a smaller size than the semiconductor nanowire 215_1 of FIG. 8B. For example, the height T1 and the width W1 of the semiconductor nanowire 215_2 are smaller than the height T2 and the width W4 of the semiconductor nanowire 215_1, respectively. In some embodiments, the size (e.g., the height T1 and the width W1) of the semiconductor nanowire 215_2 is substantially equal to that of the semiconductor nanowire 210_1 of FIG. 8A. According to various device requirements, the semiconductor nanowires of each PMOS transistor may be thicker, equal or thinner than the semiconductor nanowires of each NMOS transistor.

In some embodiments, the Ge atomic concentration of the SiGe channel regions formed by the semiconductor nanowires 215_2 of a PMOS transistor is within a range of 5%~35%. In some embodiments, the Ge atomic concentration of the SiGe channel regions can be modified to form various PMOS transistors with different Ge atomic concentration.

FIG. 8D illustrates a cross-sectional view of a semiconductor nanowire 215_3, in accordance with some embodiments of the disclosure. In FIG. 8D, the semiconductor nanowire 215_3 is a SiGe-base nanowire. In some embodiments, the SiGe-base nanowire is formed by doping Ge into a Si-base semiconductor layer. Therefore, compared with the semiconductor nanowires 215_1 of FIG. 8B and 215_2 of FIG. 8C, no epitaxy layer is formed in the semiconductor nanowire 215_3.

In some embodiments, the Ge atomic concentration of the SiGe channel regions formed by the semiconductor nanowires 215_3 of a PMOS transistor is within a range of 5%~35%. In some embodiments, the Ge atomic concentration of the SiGe channel regions can be modified to form various PMOS transistors with different Ge atomic concentration.

Figure 9:
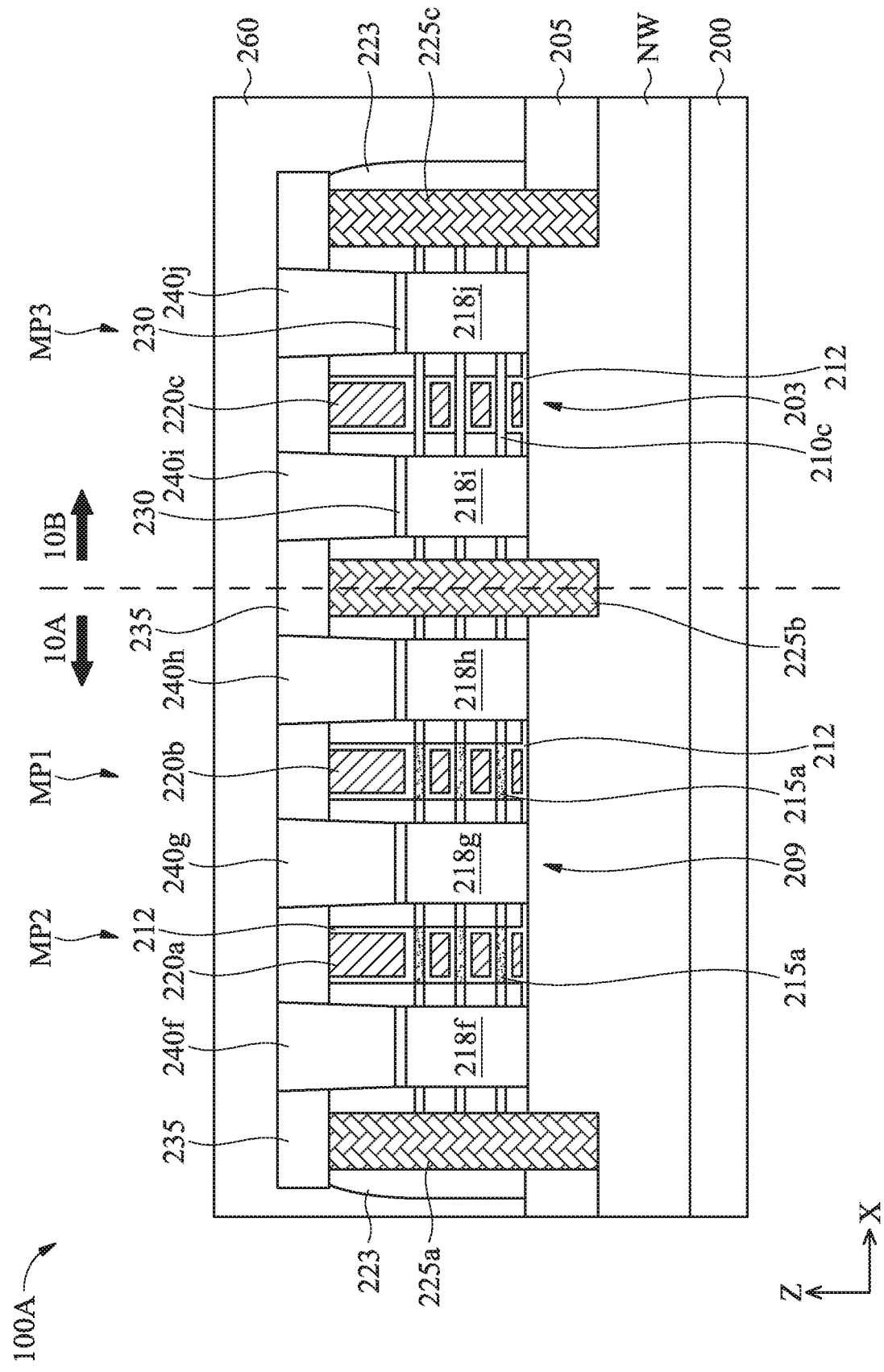
FIG. 9 illustrates a cross-sectional view of the semiconductor structure of the logic circuit along line C-CC in FIG. 5, in accordance with some embodiments of the disclosure.

FIG. 9 illustrates a cross-sectional view of the semiconductor structure of the logic circuit 110A along line C-CC in FIG. 5, in accordance with some embodiments of the disclosure. The N-type well region NW is formed over the substrate 200. The well portions 203 and 209 are formed over the N-type well region NW, and the well portions 203 and 209 are separated by the dielectric-base gate 225b. As described above, the spacers 223 are formed on the sidewalls of the dielectric-base gates 225a through 225c and the gate electrodes 220a through 220c.

The source/drain regions 218f, 218g and 218h are formed on the well portion 209, and the source/drain regions 218i and 218j are formed on the well portion 203. In some embodiments, the source/drain regions 218f, 218g, 218h, 218i and 218j include SiGe with Boron (e.g., B11) content. In some embodiments, the source/drain regions 218f, 218g, 218h, 218i and 218j are formed by epitaxially growing Boron in SiGe material. Furthermore, the source/drain silicide regions 230 are formed on the source/drain regions 218f, 218g, 218h, 218i and 218j. The contacts 240f, 240g, 240h, 240i and 240j are formed on the source/drain silicide regions 230. In some embodiments, each of the contacts 240f, 240g, 240h, 240i and 240j includes a metal plug (not shown) and a dielectric (not shown) formed on the sidewall of the metal plug, and the metal plug is surrounded by the dielectric.

In the first logic cell 10A, the semiconductor nanowires 215a are stacked along the Z-direction over the well portion 209, and each semiconductor nanowire 215a is a SiGe nanowire that forms a SiGe channel region for the corresponding PMOS transistor. For example, each semiconductor nanowire 215a between the source/drain regions 218f and 218g forms a SiGe channel region of the PMOS transistor MP2, and the SiGe channel region of the PMOS transistor MP2 is surrounded by the gate dielectric layer 212 and the gate electrode 220a. Moreover, each semiconductor nanowire 215a between the source/drain regions 218g and 218h forms a SiGe channel region of the PMOS transistor MP1, and the SiGe channel region of the PMOS transistor MP1 is surrounded by the gate dielectric layer 212 and the gate electrode 220b. As described above, the nanowires 215a are formed by doping Ge into the Si-base nanowire or formed by epitaxially growing SiGe or Ge material on the Si-base nanowire and then annealing. In some embodiments, the number of stacked semiconductor nanowires 215a may be between 2 and 10.

In the first logic cell 10A, the dielectric-base gates 225a and 225b are located on the edge of the semiconductor nanowires 215a. For example, the dielectric-base gate 225a is arranged on the left edge of the semiconductor nanowires 215a, and the dielectric-base gate 225b is arranged on the right edge of the semiconductor nanowires 215a. Moreover, the dielectric-base gates 225a and 225b are deeper than the source/drain regions 218f, 218g and 218h.

In the second logic cell 10B, the semiconductor nanowires 210c are stacked along the Z-direction over the well portion 203, and each semiconductor nanowire 210c is a Si nanowire that forms a Si channel region for the PMOS transistor MP3. For example, the semiconductor nanowire 210c between the source/drain regions 218i and 218j forms a Si channel region of the PMOS transistor MP3, and the Si channel region of the PMOS transistor MP3 is surrounded by the gate dielectric layer 212 and the gate electrode 220c. As described above, the nanowires 210c do not include Ge material. In some embodiments, the number of stacked semiconductor nanowires 210c may be between 2 and 10.

In the second logic cell 10B, the dielectric-base gates 225b and 225c are located on the edge of the semiconductor nanowires 210c. For example, the dielectric-base gate 225b is arranged on the left edge of the semiconductor nanowires 210c, and the dielectric-base gate 225c is arranged on the right edge of the semiconductor nanowires 210c. Moreover, the dielectric-base gates 225b and 225c are deeper than the source/drain regions 218i and 218j.

In some embodiments, one or more work-function layers (not shown) are formed between the gate dielectric layer 212 and the gate electrodes 220a through 220c. In some embodiments, the work function layer is made of metal material, and the metal material may include P-work-function metal. The P-work-function metal includes titanium nitride (TiN), tungsten nitride (WN), tantalum nitride (TaN), ruthenium (Ru) or a combination thereof.

In some embodiments, the work-function layer (not-shown) formed between the gate dielectric layer 212 and the gate electrode 220b and the work-function layer (not-shown) formed between the gate dielectric layer 212 and the gate electrode 220c are made of the same material, and the threshold voltage (Vth or Vt) of the PMOS transistor MP1 is different from the threshold voltage of the PMOS transistor MP3 due to the materials of the semiconductor nanowires 210c and 215a are different. In some embodiments, for the same work-function layer, a first threshold voltage Vt1 of the PMOS transistor MP3 (e.g., the first-type PMOS transistor) is greater than a second threshold voltage Vt2 of the PMOS transistor MP1 (e.g., the second-type PMOS transistor), i.e., Vt1>Vt2. In some embodiments, the different between the first threshold voltage Vt1 and the second threshold voltage Vt2 is greater than 100 mV. Due to the higher threshold voltage of the PMOS transistor MP3 (e.g., the first-type PMOS transistor), the PMOS transistor MP3 can be implemented in the SRAM cells and/or I/O cells of the IC.

In some embodiments, the work-function layer includes multiple layers combination and selected from a group of TiN, TaN, TiAl, TiAlN, W, or a combination thereof. In some embodiments, the work-function layer is formed by multiple patterns and multiple metal depositions for multiple work-function schemes.

In some embodiments, multiple work-function layers are used to extend the threshold voltage tuning range, so as to allow the PMOS transistors with the Si channel regions and the PMOS transistors with the SiGe channel regions for various threshold voltage requirements. For example, the PMOS transistor P1 with the first work-function layer and the PMOS transistor MP1 with both the first and second work-function layers have different threshold voltages due to the work-function characteristics of the first and second work-function layers being different. Similarly, the PMOS transistor MP1 with the first work-function layer and the PMOS transistor MP1 with the second work-function layer also have different threshold voltages.

In some embodiments, the gate dielectric layer 212 may include Lanthanum (La) dopant. Moreover, the PMOS transistors MP1 and MP2 with the La-doped gate dielectric layer 212 are the third-type PMOS transistors having a third threshold voltage Vt3. In some embodiments, for the same work-function layer, the first threshold voltage Vt1 of the PMOS transistor MP3 (e.g., the first-type PMOS transistor) is greater than the third threshold voltage Vt3 of the PMOS transistor having the gate dielectric layer 212 with La dopant (e.g., the third-type PMOS transistor), i.e., Vt1>Vt3. Furthermore, the different between the first threshold voltage Vt1 and the third threshold voltage Vt3 is greater than 30 mV. In some embodiments, the third threshold voltage Vt3 of the PMOS transistor having the gate dielectric layer 212 with La dopant (e.g., the third-type PMOS transistor) is greater than the second threshold voltage Vt2 of the PMOS transistor MP1/MP2 having the gate dielectric layer 212 without La dopant (e.g., the second-type PMOS transistor), i.e., Vt3>Vt2. Furthermore, the different between the second threshold voltage Vt2 and the third threshold voltage Vt3 is greater than 30 mV.

In some embodiments, the PMOS transistor MP3 includes the La-doped gate dielectric layer 212, and the PMOS transistor MP3 with the La-doped gate dielectric layer 212 is the fourth-type PMOS transistor having a fourth threshold voltage Vt4. In some embodiments, for the same work-function layer, the fourth threshold voltage Vt4 is greater than the third threshold voltage Vt3 of the PMOS transistor having the gate dielectric layer 212 without La dopant (e.g., the first-type PMOS transistor), i.e., Vt4>Vt3.

As described above, multiple work-function layers can be used to tune the threshold voltages for the transistors. However, using the multiple work-function layers will require wider channel-channel (or nanowire-nanowire) space (e.g., the first space Si of the semiconductor nanowires 210b and the second space S2 of the semiconductor nanowires 210c of FIG. 6) or the complex processes for various work-function materials, such as depositing a first work-function metal, patterning the first work-function metal, selective removing the patterned first work-function metal, and then depositing a second work-function metal, patterning the second work-function metal, selective removing the patterned second work-function metal, and etc. . . . ). By doping La into the gate dielectric layer 212, the channel-channel space can be keep due to the thickness of the gate dielectric layer 212 is kept the same. Furthermore, by using the gate dielectric layer 212 with the La dopant, the threshold voltages of the PMOS and NMOS transistors can be modified. The NMOS transistors having the gate dielectric layer 212 with La dopant can reduce the threshold voltage in a range of about 30 mV to about −200 mV. Therefore, for the same work-function layer, a threshold voltage of the NMOS transistor having the gate dielectric layer 212 without La dopant can is greater than a threshold voltage of the NMOS transistor having the gate dielectric layer 212 with La dopant. Furthermore, the PMOS transistors having the gate dielectric layer 212 with La dopant can increase the threshold voltage in a range of about 30 mV to about 200 mV. Therefore, for the same work-function layer, a threshold voltage of the PMOS transistor having the gate dielectric layer 212 without La dopant can is less than a threshold voltage of the PMOS transistor having the gate dielectric layer 212 with La dopant.

The hard mask layer 235 is formed over the gate electrodes 220a through 220b, the dielectric-base gates 225a through 225, and the spacers 223. Furthermore, the hard mask layer 235 is made of dielectric material. In some embodiments, the top surface of the hard mask layer 235 is aligned with the top surface of the contacts 240f, 240g, 240h, 240i and 240j.

Figure 10:
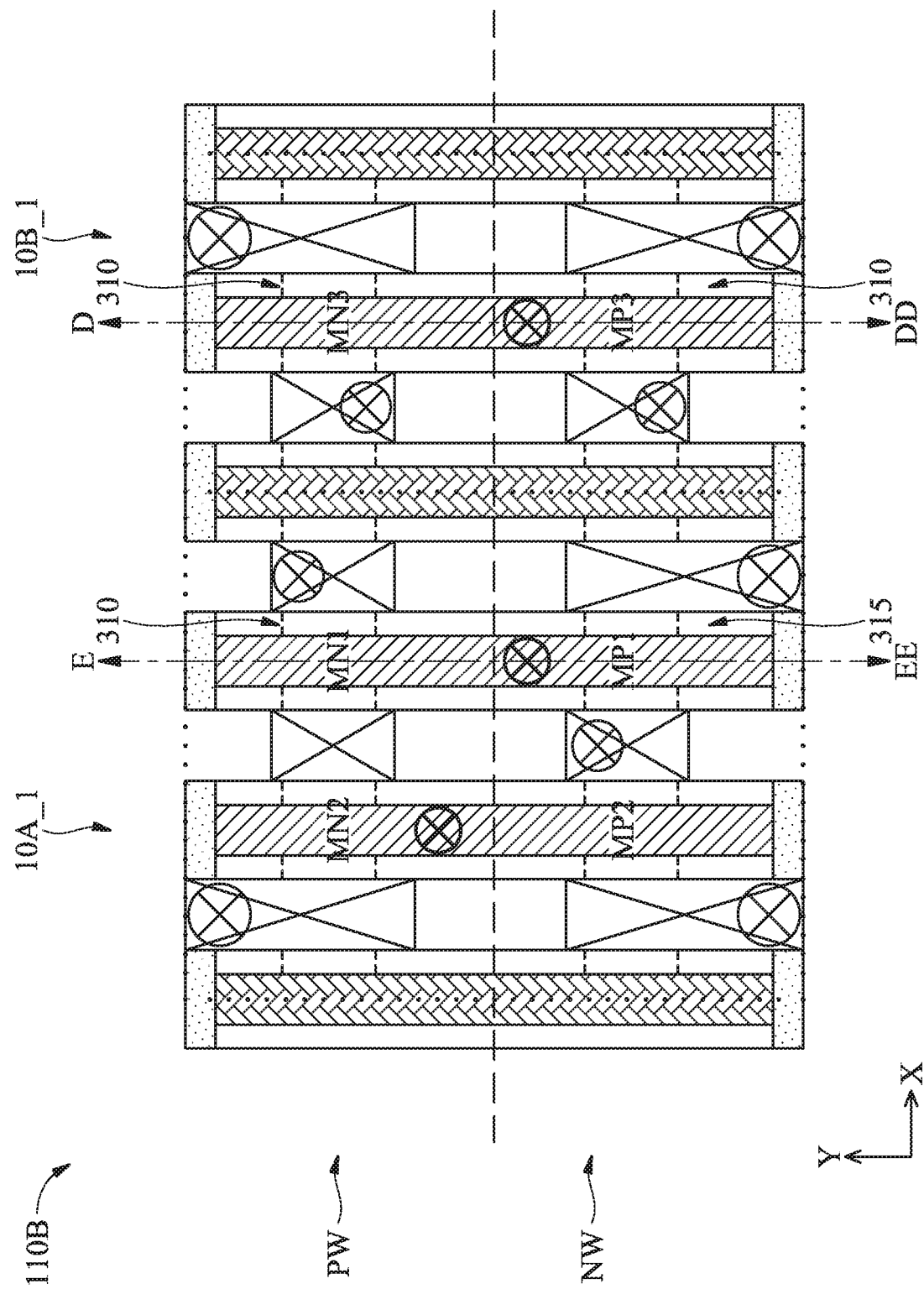
FIG. 10 illustrates a layout of features of the logic cells in a logic circuit, in accordance with some embodiments of the disclosure.

FIG. 10 illustrates a layout of features of the logic cells in a logic circuit 110B, in accordance with some embodiments of the disclosure. In FIG. 10, the features of the logic circuit 110B are shown in a via level and lower, in accordance with some embodiments of the disclosure. The configuration of the first logic cell 10A_1 and the second logic cell 10B_1 in FIG. 10 is similar to that of the first logic cell 10A and the second logic cell 10B in FIG. 5. The difference between FIG. 10 and FIG. 5 is that the channel regions of the PMOS transistor MP3 and the NMOS transistors MN1 through MN3 are formed by the semiconductor nanosheets 310, and the channel regions of the PMOS transistors MP1 and MP2 are formed by the semiconductor nanosheets 315. Furthermore, the semiconductor nanosheets 310 and 315 have greater area than the semiconductor nanowires 210a through 210c and 215a in layout. As described above, the semiconductor nanosheet 315 is a SiGe-base nanosheet, and the semiconductor nanosheets 310 are the Si-base nanosheets.

Figure 11A:
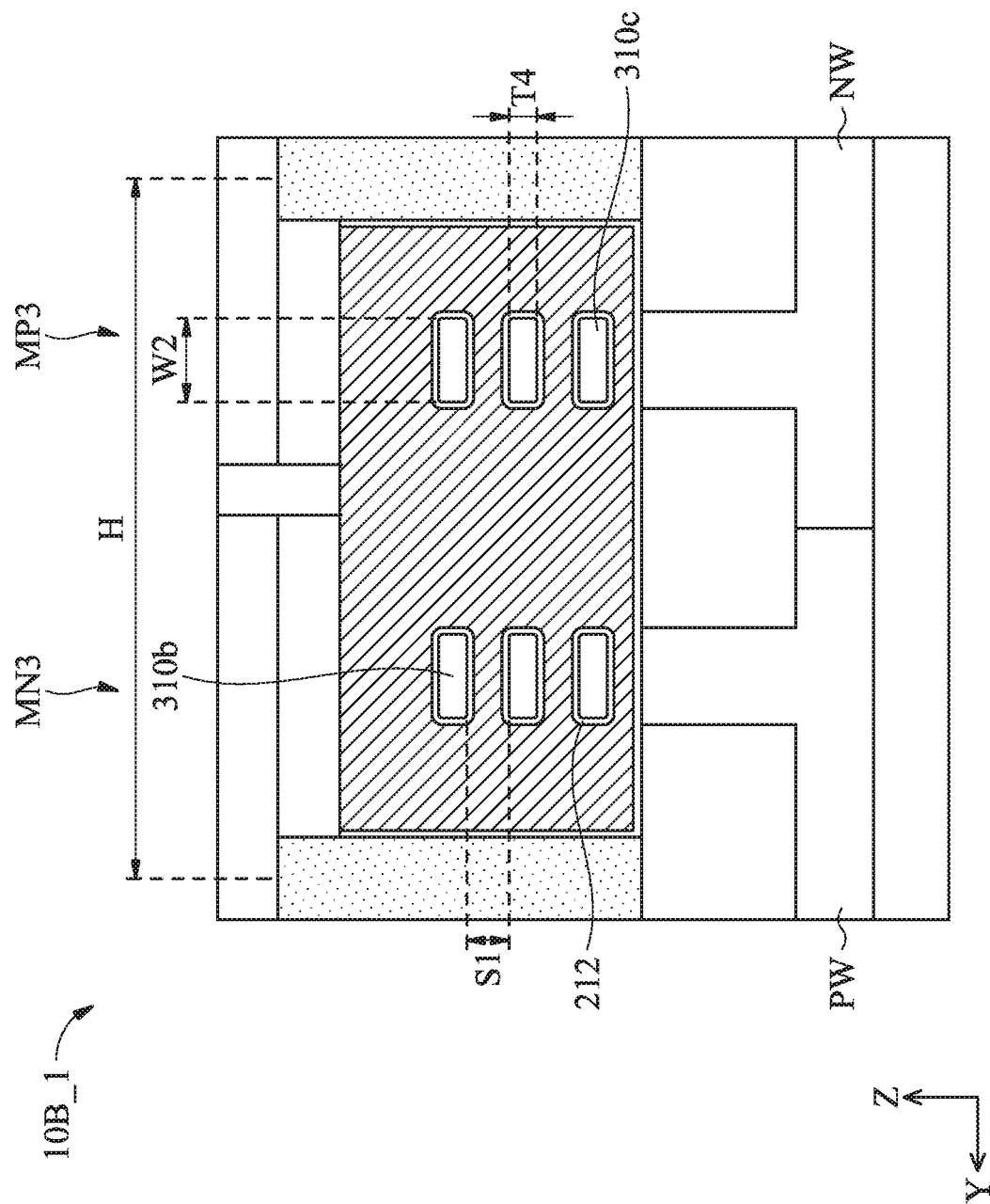
FIG. 11A illustrates a cross-sectional view of the semiconductor structure of the logic circuit along line D-DD in FIG. 10, in accordance with some embodiments of the disclosure.

FIG. 11A illustrates a cross-sectional view of the semiconductor structure of the logic circuit 110B along line D-DD in FIG. 10, in accordance with some embodiments of the disclosure. The cross-sectional view of the second logic cell 10B_1 in FIG. 11A is similar to that of the second logic cell 10B in FIG. 6. The difference between FIG. 11A and FIG. 6 is that the semiconductor nanosheets 310b and 310c have greater cross-sectional area than the semiconductor nanowires 210b and 210c in a plane formed by the Y-direction and the Z-direction. In some embodiments, the semiconductor nanosheet 310c has a width W2 along to the Y-direction and a height T4 along to the Z-direction. In some embodiments, the width W2 is greater than twice the height T4. In some embodiments, the height T4 of the semiconductor nanosheets 310b and 310c is substantially equal to the height T1 of the semiconductor nanowire 210_1 in FIG. 8A. In some embodiments, the thickness of the semiconductor nanosheets 310b and 310c is within a range about 3 nm to about 10 nm.

Figure 11B:
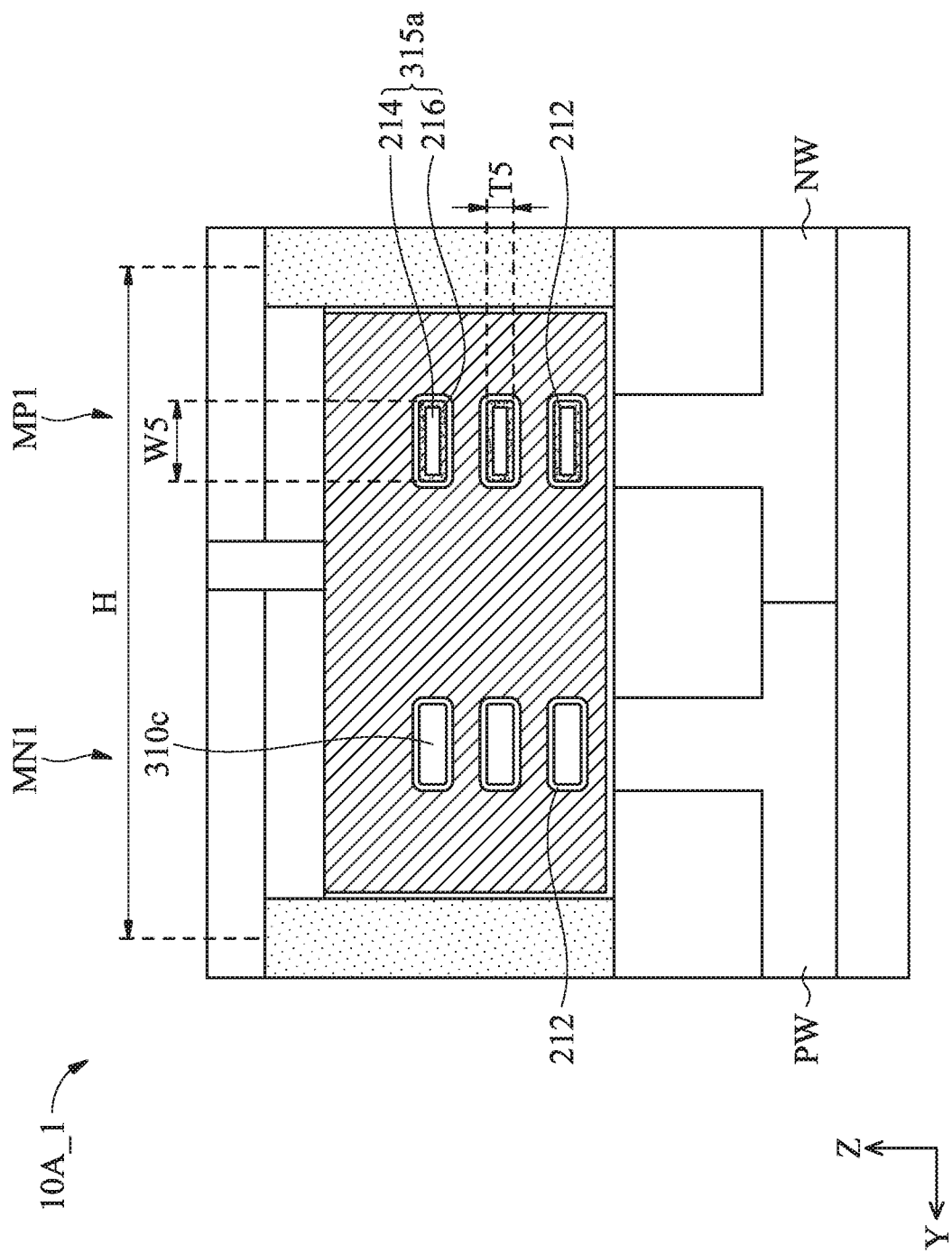
FIG. 11B illustrates a cross-sectional view of the semiconductor structure of the logic circuit along line E-EE in FIG. 10, in accordance with some embodiments of the disclosure.

FIG. 11B illustrates a cross-sectional view of the semiconductor structure of the logic circuit 110B along line E-EE in FIG. 10, in accordance with some embodiments of the disclosure. The cross-sectional view of the second logic cell 10A_1 in FIG. 11B is similar to that of the second logic cell 10A in FIG. 7. The difference between FIG. 11B and FIG. 7 is that the semiconductor nanosheets 310a and 315a have greater cross-sectional area than the semiconductor nanowires 210a and 215a in a plane formed by the Y-direction and the Z-direction. In some embodiments, the semiconductor nanosheet 310c has a width W5 along to the Y-direction and a height T5 along to the Z-direction. In some embodiments, the width W5 is greater than twice the height T5. In some embodiments, the height T5 of the semiconductor nanosheet 315a is substantially equal to the height T2 of the semiconductor nanowire 215_1 in FIG. 8B or the height T1 of the semiconductor nanowire 215_2 in FIG. 8C or 215_3 in FIG. 8D. In some embodiments, the thickness of the semiconductor nanosheets 310a and 315a is within a range about 3 nm to about 10 nm.

In some embodiments, the ratio of the width W2 of FIG. 11A to W5 of FIG. 11B is within about 5%, and the ratio of the height T4 of FIG. 11A to T5 of FIG. 11B is within about 5%.

Each first-type PMOS transistor includes multiple vertically stacked Si channel regions, and each Si channel region is formed by a Si-base nanowire (e.g., the semiconductor nanowire 210 of FIG. 5 or 210_1 of FIG. 8A) or a Si-base nanosheet (e.g., the semiconductor nanosheet 310 of FIG. 10). The first-type PMOS transistor has higher threshold voltage for low standby cells (both Isoff and junction leakage reduction), or I/O PMOSFET.

Furthermore, each second-type PMOS transistor includes multiple vertically stacked SiGe channel regions, and each SiGe channel region is formed by a SiGe-base nanowire (e.g., the semiconductor nanowire 215a of FIG. 5, 215_1 of FIG. 8B, 215_2 of FIG. 8C, or 215_3 of FIG. 8D) or a SiGe-base nanosheet (e.g., the semiconductor nanosheet 315 of FIG. 10). The second-type PMOS transistor has lower threshold voltage (and Ion/Ioff >10% gain) for high speed driven cells.

Figure 12A:
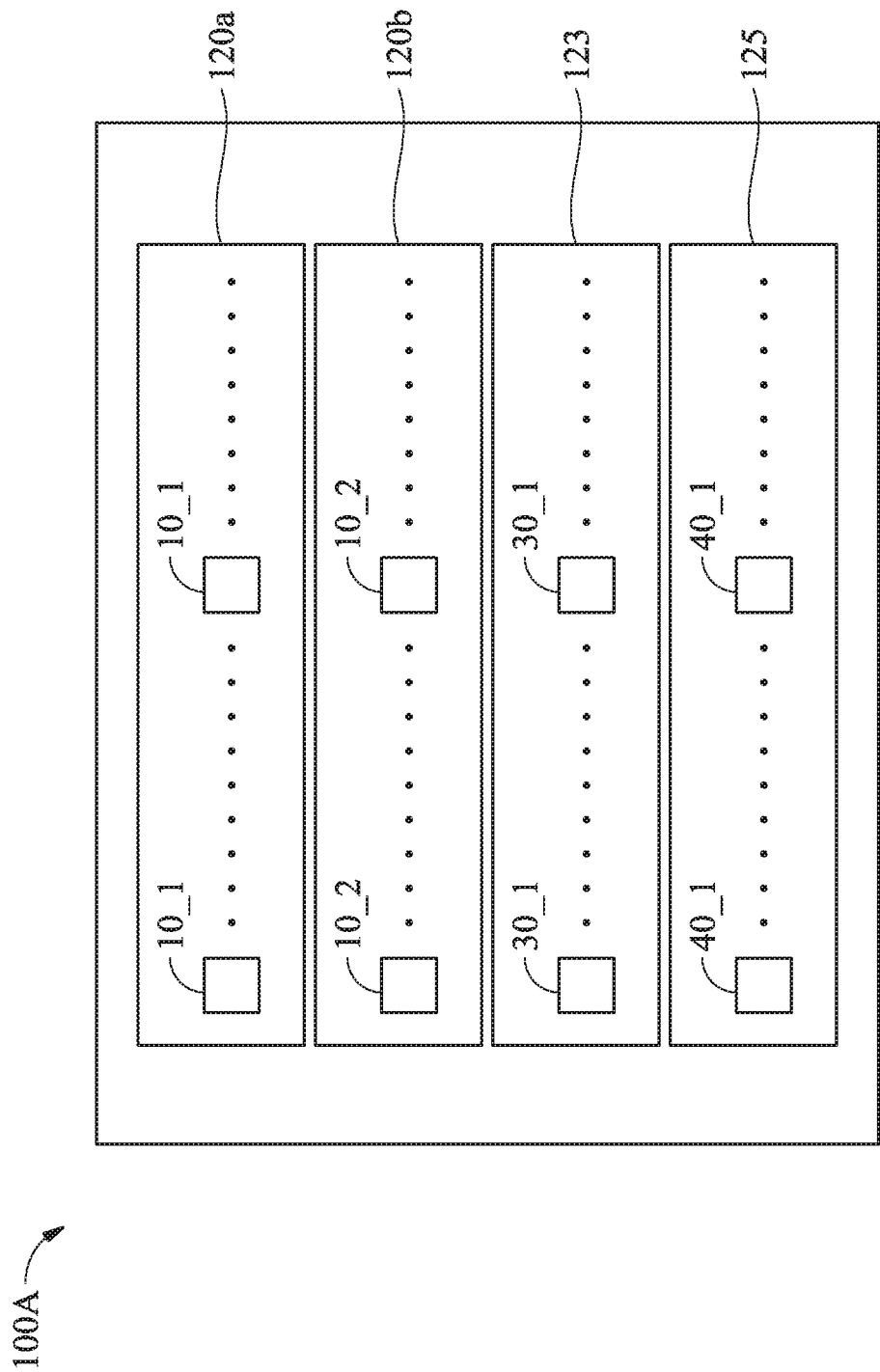
FIG. 12A is a simplified diagram of an IC, in accordance with some embodiments of the disclosure.

FIG. 12A is a simplified diagram of an IC 100A, in accordance with some embodiments of the disclosure. The IC 100A includes a logic core area 120a, a logic core area 120b, a SRAM area 123 and an I/O area 125. In the IC 100A, the logic core areas 120a and 120b, the SRAM area 123 and the I/O area 125 are separated from each other. For example, the P-type well regions of the logic core area 120a are separated from the P-type well regions of the logic core area 120b, and the N-type well regions of the logic core area 120a are separated from the N-type well regions of the logic core area 120b.

The logic core area 120a includes one or more logic circuits formed by multiple logic cells 10_1. In some embodiments, the logic cells 10_1 are the standard cells (e.g., inverter (INV), AND, OR, NAND, NOR, Flip-Flop, SCAN, etc.), a combination thereof or specific functional cells. Furthermore, the PMOS transistors of the logic cells 10_1 may be the first-type PMOS transistors with multiple vertically stacked Si channel regions.

In FIG. 12A, the logic core area 120b includes one or more logic circuits formed by multiple logic cells 10_2. In some embodiments, the logic cells 10_2 are the standard cells (e.g., inverter (INV), AND, OR, NAND, NOR, Flip-Flop, SCAN, etc.), a combination thereof or specific functional cells. Furthermore, the PMOS transistors of the logic cells 10_2 may be the second-type PMOS transistors with multiple vertically stacked SiGe channel regions.

The SRAM area 123 includes one or more memory array formed by multiple SRAM cells 30_1. Furthermore, the PMOS transistors (e.g., the pull-up transistors) of the SRAM cells 30_1 may be the first-type PMOS transistors with multiple vertically stacked Si channel regions.

The I/O area 125 includes one or more input/output circuit formed by multiple I/O cells 40_1. Moreover, the PMOS transistors of the I/O cells 40_1 may be the first-type PMOS transistors with multiple vertically stacked Si channel regions.

In the IC 100A, the threshold voltages of the first-type PMOS transistors in the logic core area 120a, the SRAM area 123 and the I/O area 125 are different from that of the second-type PMOS transistors in the logic core area 120b.

Figure 12B:
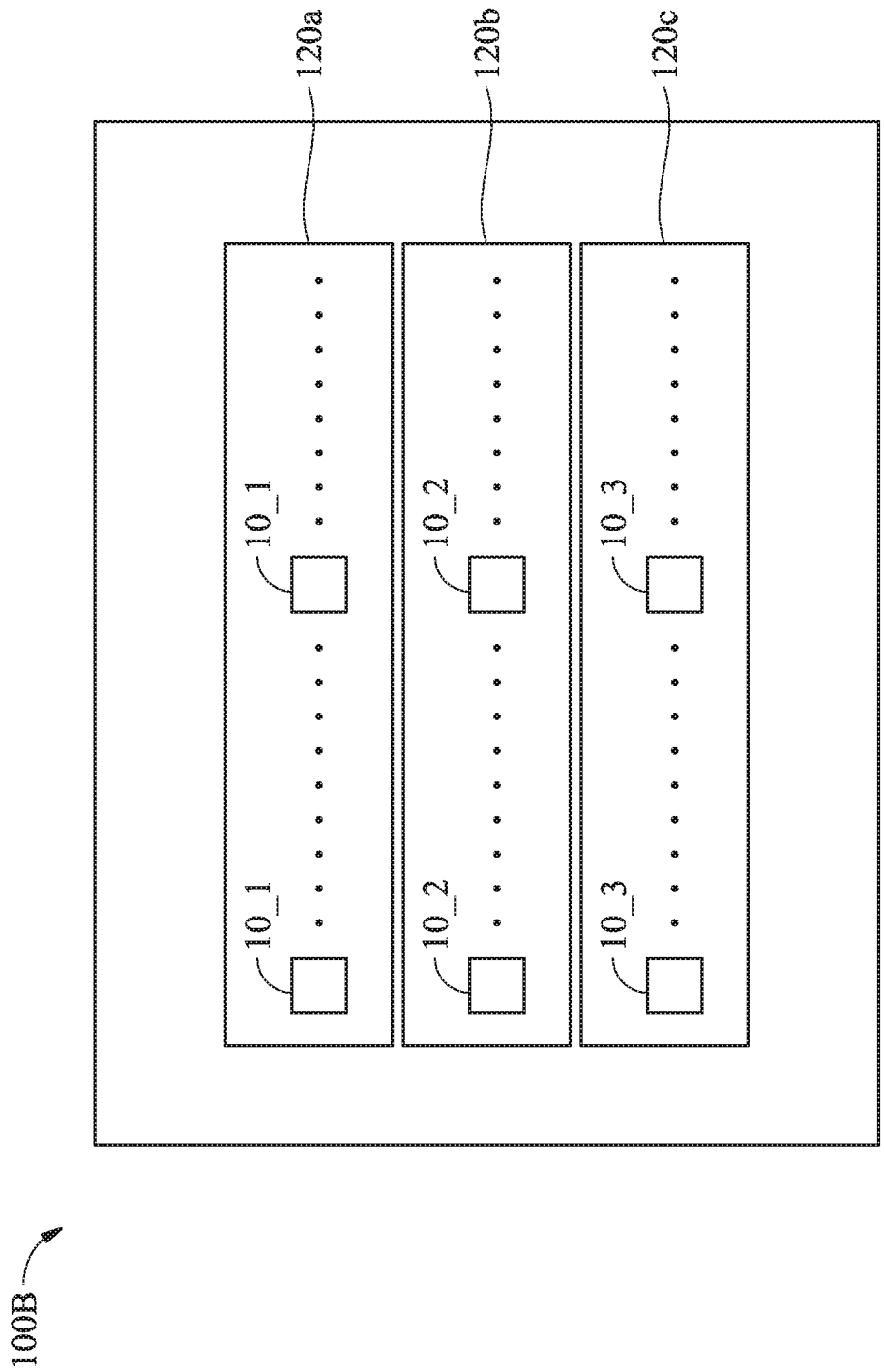
FIG. 12B is a simplified diagram of an IC, in accordance with some embodiments of the disclosure.

FIG. 12B is a simplified diagram of an IC 100B, in accordance with some embodiments of the disclosure. The IC 100B includes a logic core area 120a, a logic core area 120b, and a logic core area 120c. In the IC 100B, the logic core areas 120a, 120b, and 120c are separated from each other.

The logic core areas 120a and 120b have been described in the IC 100A of FIG. 12A and will not be described here. The logic core area 120c includes one or more logic circuits formed by multiple logic cells 10_3. In some embodiments, the logic cells 10_3 are the standard cells (e.g., inverter (INV), AND, OR, NAND, NOR, Flip-Flop, SCAN, etc.), a combination thereof or specific functional cells. Furthermore, the PMOS transistors of the logic cells 10_3 may be the third-type PMOS transistors that include multiple vertically stacked SiGe channel regions with the La-doped gate dielectric layer.

In the third-type PMOS transistor, each SiGe channel region is formed by a SiGe-base nanowire (e.g., the semiconductor nanowire 215a of FIG. 5, 215_1 of FIG. 8B, 215_2 of FIG. 8C, or 215_3 of FIG. 8D) or a SiGe-base nanosheet (e.g., the semiconductor nanosheet 315a of FIG. 10). As described above, by using multiple work-function layers and the gate dielectric layer with La dopant, the threshold voltages of the PMOS transistors can be modified.

FIG. 12C is a simplified diagram of an IC 100C, in accordance with some embodiments of the disclosure. The IC 100C includes a logic core area 120a, a logic core area 120*b*, and a logic core area 120*b*'. In the IC 100C, the logic core areas 120*a*, 120*b*, and 120*b*' are separated from each other.

The logic core areas 120*a* and 120*b* have been described in the IC 100A of FIG. 12A and will not be described here. The logic core area 120*b*' includes one or more logic circuits formed by multiple logic cells 10_2'. Furthermore, the PMOS transistors of the logic cells 10_2' may be the second-type PMOS transistors with multiple vertically stacked SiGe channel regions. The difference between the logic cells 10_2' of logic core area 120*b*' and the logic cells 10_2 of the logic core area 120*b* is that the Ge atomic concentration of the SiGe channel regions in the logic cell 10_2 is greater than the Ge atomic concentration of the SiGe channel regions in the logic cell 10_2'.

In some embodiments, the Ge atomic concentration difference between the logic cells 10_2 and 10_2' is about 5%. In some embodiments, the Ge atomic concentration of the SiGe channel regions in the logic cell 10_2 is within a range of about 15% to about 35%, and the Ge atomic concentration of the SiGe channel regions in the logic cell 10_2' is within a range of about 5% to about 14.5%.

Figure 13A:
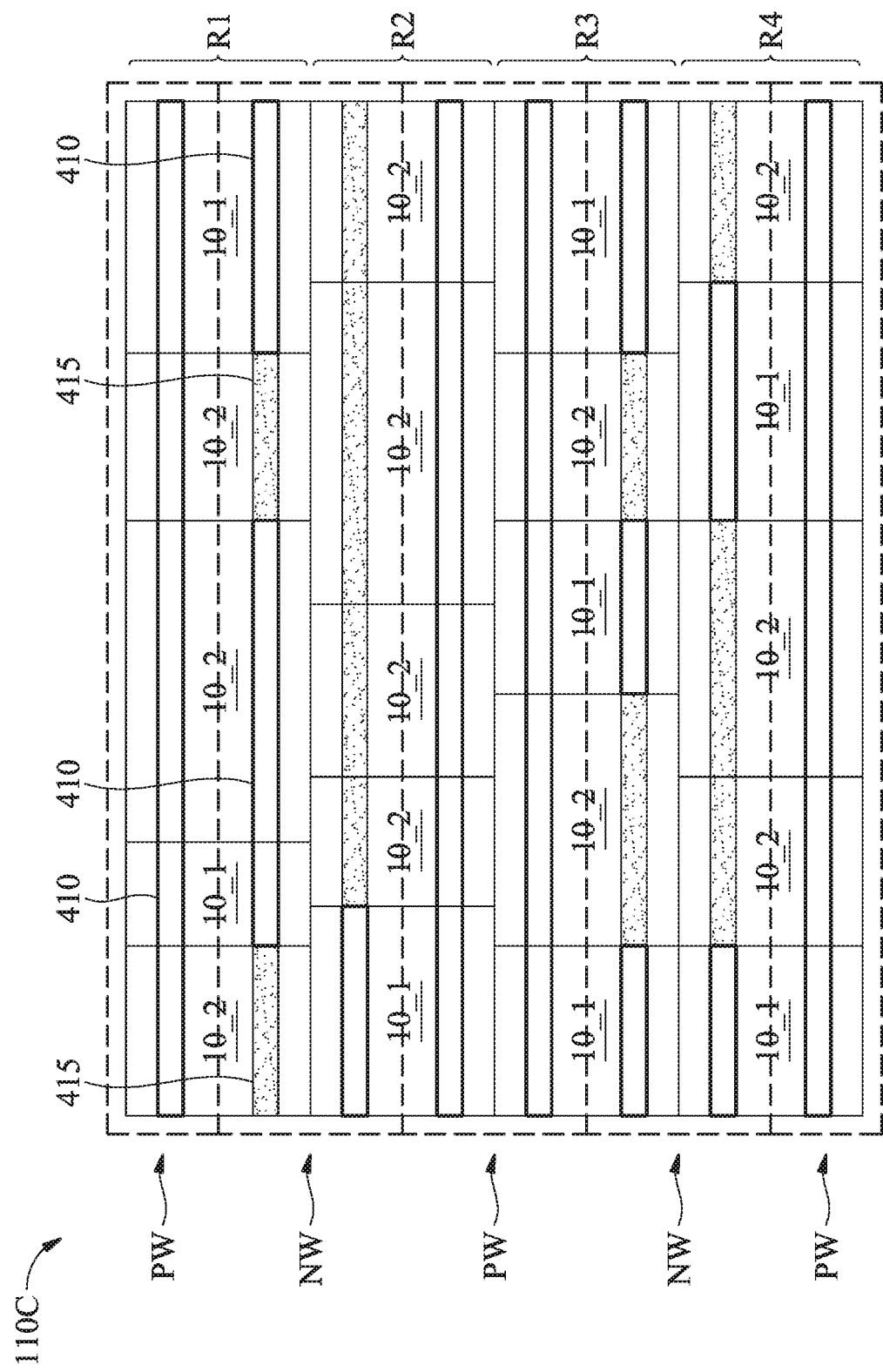
FIG. 13A is a simplified diagram of a logic circuit, in accordance with some embodiments of the disclosure.

FIG. 13A is a simplified diagram of a logic circuit 110C, in accordance with some embodiments of the disclosure. In the logic circuit 110C, the logic cells 10_1 and 10_2 are arranged in a cell array. Furthermore, the logic cells 10_1 and 10_2 are arranged in the same row of the cell array. For example, three logic cells 10_1 and two logic cells 10_2 are arranged in the row R1, one logic cells 10_1 and four logic cells 10_2 are arranged in the row R2, three logic cells 10_1 and two logic cells 10_2 are arranged in the row R3, and two logic cells 10_1 and three logic cells 10_2 are arranged in the row R4.

In the logic circuit 110C, the logic cells 10_1 include the NMOS transistors with multiple vertically stacked Si channel regions 410 (e.g., the semiconductor nanowire 210 of FIG. 5, or the semiconductor nanowire 310 of FIG. 10), and the PMOS transistors with multiple vertically stacked Si channel regions 410 (e.g., the semiconductor nanowire 210 of FIG. 5, or the semiconductor nanowire 310 of FIG. 10). Furthermore, the logic cells 10_2 include the NMOS transistors with multiple vertically stacked SiGe channel regions 410 (e.g., the semiconductor nanowire 210 of FIG. 5, or the semiconductor nanowire 310 of FIG. 10), and the PMOS transistors with multiple vertically stacked SiGe channel regions 415 (e.g., the semiconductor nanowire 215 of FIG. 5, or the semiconductor nanowire 315 of FIG. 10). In each of the rows R1 through R4, the vertically stacked SiGe channel regions 415 and the vertically stacked Si channel regions 410 are formed in the same N-type well region.

In the logic circuit 110C, the dielectric-base dummy gates (not shown), such as the dielectric-base dummy gates 225*a* and 225*b* of FIG. 5, are formed in the boundary of each of the logic cells 10_1 and 10_2. In other word, the stacked channel regions of two adjacent logic cells 10_1/10_2 are separated from each other by the dielectric-base dummy gate. In some embodiments, the logic cells 10_1 and 10_2 are electrically isolated by the STI. In some embodiments, the logic cells 10_1 and 10_2 are electrically isolated by the transistors.

Figure 13B:
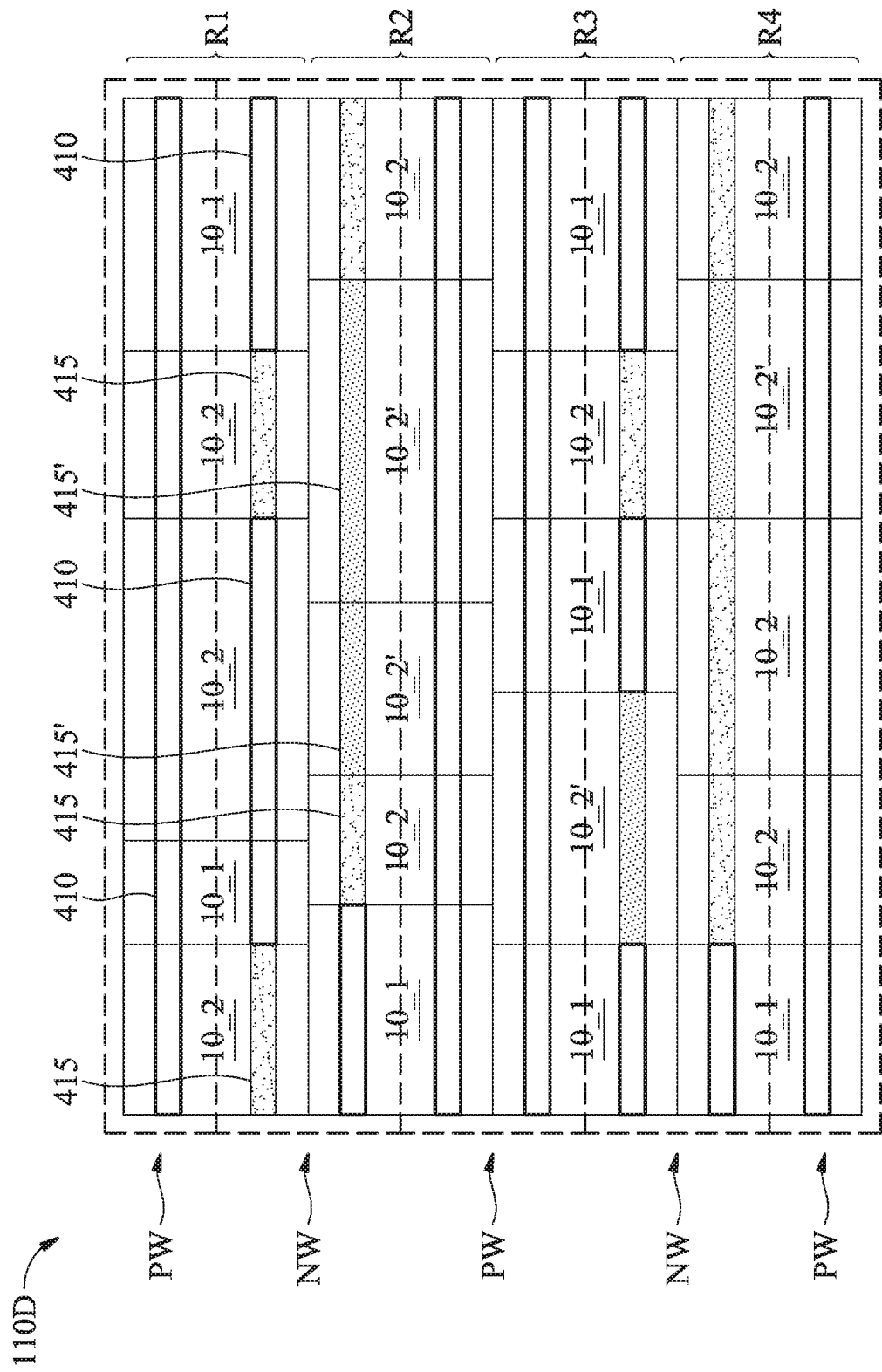
FIG. 13B is a simplified diagram of a logic circuit, in accordance with some embodiments of the disclosure.

FIG. 13B is a simplified diagram of a logic circuit 110D, in accordance with some embodiments of the disclosure. In the logic circuit 110D, the logic cells 10_1, 10_2 and 10_2' are arranged in a cell array. Furthermore, the logic cells 10_1, 10_2 and 10_2' are arranged in the same row of the cell array. For example, three logic cells 10_1 and two logic cells 10_2 are arranged in the row R1, one logic cells 10_1, two logic cells 10_2 and two logic cells 10_2' are arranged in the row R2, three logic cells 10_1, one logic cells 10_2, and one logic cells 10_2' are arranged in the row R3, and one logic cells 10_1, three logic cells 10_2, and one logic cells 10_2' are arranged in the row R4. As described above, the SiGe channel regions 415 of the logic cells 10_2 and the SiGe channel regions 415' of the logic cells 10_2' have different Ge atomic concentrations. In each of the rows R1 through R4, the vertically stacked SiGe channel regions 415 and 415' and the vertically stacked Si channel regions 410 are formed in the same N-type well region.

In the logic circuit 110D, the dielectric-base dummy gates (not shown), such as the dielectric-base dummy gates 225*a* and 225*b* of FIG. 5, are formed in the boundary of each of the logic cells 10_1, 10_2 and 10_2'. In other word, the stacked channel regions of two adjacent logic cells 10_1/10_2/10_2' are separated from each other by the dielectric-base dummy gate. In some embodiments, the logic cells 10_1, 10_2 and 10_2' are electrically isolated by the STI. In some embodiments, the logic cells 10_1, 10_2 and 10_2' are electrically isolated by the transistors.

In an IC, the semiconductor nanowires/nanosheets including SiGe material are configured to serve as the channel regions of the P-type GAA FETs within the standard cells, and the semiconductor nanowires/nanosheets including non-SiGe material (e.g., Si) are configured to serve as the channel regions of the P-type GAA FETs within the SRAM cells, the standard cells, and I/O cells.

Embodiments of ICs including multiple standard cells and multiple SRAM cells are provided. The standard cells include the P-type GAA FETs including SiGe channels formed by the SiGe-base semiconductor nanowires/nanosheets stacked vertically. Moreover, some standard cells include the P-type GAA FETs including Si channels formed by the Si-base semiconductor nanowires/nanosheets stacked vertically. Furthermore, the SRAM cells include the P-type GAA FETs including Si channels formed by the Si-base semiconductor nanowires/nanosheets stacked vertically. Therefore, high channel strain P-type GAA FETs (e.g., Ion/Ioff>10% gain) for the standard cells (e.g., speed driven logic circuit) and high threshold voltage (Vt) P-type GAA FET (that includes purely Si channel without extra channel strain layer) of SRAM cell are provided for write margin improvement as well as low standby requirements. Extra high threshold voltage GAA FETs are provided for lower leakage requirement devices in SRAM cells and STD cells.

In some embodiments, an integrated circuit (IC) is provided. The IC includes a plurality of P-type gate-all-around (GAA) field-effect transistors (FETs). At least one first P-type GAA FET includes a plurality of silicon (Si) channel regions vertically stacked over an N-type well region. At least one second P-type GAA FET includes a plurality of silicon germanium (SiGe) channel regions vertically stacked over the N-type well region.

In some embodiments, an integrated circuit (IC) is provided. The IC includes a first P-type gate-all-around (GAA) field-effect transistor (FET), a second P-type GAA FET, and a third P-type GAA FET. The first P-type GAA FET include a plurality of first silicon (Si) channel regions vertically stacked over a substrate. The second P-type GAA FET includes a plurality of first silicon germanium (SiGe) channel regions vertically stacked over the substrate. The third P-type GAA FET includes a plurality of second SiGe channel regions vertically stacked over the substrate. The second SiGe channel regions are surrounded by a first gate electrode. A gate dielectric layer is formed between the second SiGe channel regions and the first gate electrode, and the gate dielectric layer includes Lanthanum-doped (La-doped) dielectric material.

In some embodiments, an integrated circuit (IC) is provided. The IC includes a plurality of logic cells arranged in an array. A first logic cell includes at least one first P-type gate-all-around (GAA) field-effect transistor (FET) having a plurality of silicon (Si) channel regions vertically stacked over an N-type well region. A second logic cell includes at least one second P-type GAA FET having a plurality of first silicon germanium (SiGe) channel regions vertically stacked over the N-type well region. A third logic cell includes at least one third P-type GAA FET having a plurality of second SiGe channel regions vertically stacked over the N-type well region. Ge atomic concentration of the first SiGe channel regions are different from that of the second SiGe channel regions.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a plurality of P-type gate-all-around (GAA) field-effect transistors (FETs), comprising:
   at least one first P-type GAA FET comprising a plurality of silicon (Si) channel regions vertically stacked over an N-type well region; and
   at least one second P-type GAA FET comprising a plurality of silicon germanium (SiGe) channel regions vertically stacked over the N-type well region;
   at least one SRAM memory cell comprising the first P-type GAA FET; and
   at least one standard cell or I/O cell comprising the second P-type GAA FET.

2. The IC as claimed in claim 1, wherein each of the SiGe channel regions comprises Si-base semiconductor nanowire or nanosheet and SiGe or Ge epitaxy growth material, wherein the Si-base semiconductor nanowire or nanosheet is surrounded by the SiGe or Ge epitaxy growth material.

3. The IC as claimed in claim 2, wherein the SiGe or Ge epitaxy growth material of each of the SiGe channel regions is surrounded by a gate electrode of the second P-type GAA FET.

4. The IC as claimed in claim 1, wherein a first space between two adjacent Si channel regions vertically stacked and a second space between two adjacent SiGe channel regions vertically stacked are substantially the same.

5. The IC as claimed in claim 1, wherein in the second P-type GAA FET, Ge atomic concentration in the SiGe channel regions is in a range from about 5% to about 35%.

6. The IC as claimed in claim 1, wherein source and drain regions of the first P-type GAA FET and the second P-type GAA FET are formed by SiGe with Boron epitaxy growth material.

7. The IC as claimed in claim 1, further comprising:
   a plurality of N-type GAA FETs,
   wherein each of the N-type GAA FETs comprises a plurality of Si channel regions vertically stacked over a P-type well region, and source and drain regions of the N-type GAA FETs comprise SiP, SiC, SiPC, SiAs, Si, or a combination thereof.

8. An integrated circuit (IC), comprising:
   a first P-type gate-all-around (GAA) field-effect transistor (FET) comprising a plurality of first silicon (Si) channel regions vertically stacked over a substrate;
   a second P-type GAA FET comprising a plurality of first silicon germanium (SiGe) channel regions vertically stacked over the substrate; and
   a third P-type GAA FET comprising a plurality of second SiGe channel regions vertically stacked over the substrate,
   wherein the second SiGe channel regions are surrounded by a first gate electrode,
   wherein a gate dielectric layer is formed between the second SiGe channel regions and the first gate electrode, and the gate dielectric layer comprises Lanthanum-doped (La-doped) dielectric material,
   wherein threshold voltages of the first, second and third P-type GAA FETs are different.

9. The IC as claimed in claim 8, further comprising:
   a fourth P-type GAA FET comprising a plurality of second Si channel regions vertically stacked over the substrate,
   wherein the second Si channel regions are surrounded by a second gate electrode,
   wherein a gate dielectric layer is formed between the second Si channel regions and the second gate electrode, and the gate dielectric layer comprises La-doped dielectric material.

10. The IC as claimed in claim 8, wherein the threshold voltage of the first P-type GAA FET is greater than the threshold voltage of the third P-type GAA FET, and the threshold voltage of the third P-type GAA FET is greater than the threshold voltage of the second P-type GAA FET.

11. The IC as claimed in claim 8, further comprising:
    at least one SRAM memory cell comprising the first P-type GAA FET;
    at least one first standard cell comprising the second P-type GAA FET; and
    at least one second standard cell comprising the third P-type GAA FET.

12. The IC as claimed in claim 8, further comprising:
    at least one I/O cell comprising the first P-type GAA FET;
    at least one first standard cell comprising the second P-type GAA FET; and
    at least one second standard cell comprising the third P-type GAA FET.

13. The IC as claimed in claim 8, wherein source and drain regions of the first, second and third P-type GAA FETs are formed by SiGe with Boron epitaxy growth material.

14. The IC as claimed in claim 8, further comprising:
    a plurality of first N-type GAA FETs,
    wherein each of the first N-type GAA FETs comprises a plurality of third Si channel regions vertically stacked over the substrate, and source and drain regions of the first N-type GAA FETs comprise SiP, SiC, SiPC, SiAs, Si, or a combination thereof.

15. The IC as claimed in claim 8, wherein the first SiGe channel regions are surrounded by a third gate electrode, wherein a gate dielectric layer is formed between the first SiGe channel regions and the third gate electrode, and the gate dielectric layer is free of La-doped dielectric material.

16. An integrated circuit (IC), comprising:
a plurality of cells arranged in an array, comprising:
a first cell, comprising at least one first P-type gate-all-around (GAA) field-effect transistor (FET) having a plurality of silicon (Si) channel regions vertically stacked over an N-type well region;
a second cell, comprising at least one second P-type GAA FET having a plurality of first silicon germanium (SiGe) channel regions vertically stacked over the N-type well region; and
a third cell, comprising at least one third P-type GAA FET having a plurality of second SiGe channel regions vertically stacked over the N-type well region,
wherein Ge atomic concentration in the first SiGe channel regions is different from Ge atomic concentration in the second SiGe channel regions.

17. The IC as claimed in claim 16, wherein the first, second and third cells are arranged in one row of the array.

18. The IC as claimed in claim 16, wherein Ge atomic concentration in the first SiGe channel regions is in a range from about 15% to about 35%, and Ge atomic concentration of the second SiGe channel regions is in a range from about 5% to about 14.5%.

19. The IC as claimed in claim 16, wherein a first space between two adjacent first SiGe channel regions vertically stacked and a second space between two adjacent second SiGe channel regions vertically stacked are substantially the same.

20. The IC as claimed in claim 16, wherein each of the first, second and third cells further comprises:
at least one N-type GAA FET,
wherein the N-type GAA FET comprises a plurality of Si channel regions vertically stacked over a P-type well region, and source and drain regions of the N-type GAA FETs comprise SiP, SiC, SiPC, SiAs, Si, or a combination thereof.

* * * * *